US008130552B2

(12) United States Patent
Miwa et al.

(10) Patent No.: US 8,130,552 B2
(45) Date of Patent: Mar. 6, 2012

(54) MULTI-PASS PROGRAMMING FOR MEMORY WITH REDUCED DATA STORAGE REQUIREMENT

(75) Inventors: Toru Miwa, Yokohama (JP); Gerrit Jan Hemink, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 413 days.

(21) Appl. No.: 12/344,763

(22) Filed: Dec. 29, 2008

(65) Prior Publication Data
US 2010/0061151 A1    Mar. 11, 2010

Related U.S. Application Data

(60) Provisional application No. 61/096,221, filed on Sep. 11, 2008.

(51) Int. Cl.
*G11C 16/06* (2006.01)

(52) U.S. Cl. ......... 365/185.22; 365/185.19; 365/185.18; 365/185.24; 365/185.03

(58) Field of Classification Search ............. 365/185.03, 365/185.19, 185.18, 185.24, 185.22
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 7,023,736 B2 | 4/2006 | Cernea et al. | |
| 7,046,568 B2 | 5/2006 | Cernea | |
| 7,057,939 B2 | 6/2006 | Li | |
| 7,170,780 B2 * | 1/2007 | Kawai | 365/185.03 |
| 7,196,931 B2 | 3/2007 | Cernea et al. | |
| 7,224,614 B1 | 5/2007 | Chan | |
| 7,307,887 B2 | 12/2007 | Chen | |
| 7,443,729 B2 | 10/2008 | Li | |
| 7,454,669 B2 | 11/2008 | Kikuchi et al. | |
| 2006/0158938 A1 * | 7/2006 | Shappir et al. | 365/185.19 |
| 2006/0158947 A1 | 7/2006 | Chan et al. | |
| 2006/0221692 A1 | 10/2006 | Chen | |
| 2007/0153594 A1 * | 7/2007 | Chen | 365/195 |
| 2007/0230250 A1 | 10/2007 | Chan | |

(Continued)

OTHER PUBLICATIONS

International Search Report & The Written Opinion of the International Searching Authority dated Apr. 15, 2010, International Application No. PCT/US2009/056394 filed Sep. 9, 2009.

(Continued)

*Primary Examiner* — Vu Le
*Assistant Examiner* — Han Yang
(74) *Attorney, Agent, or Firm* — Vierra Magen Marcus & DeNiro LLP

(57) ABSTRACT

Coupling effects between adjacent floating gates in a nonvolatile storage device are reduced in a multi-pass programming operation, while reducing program data storage requirements. In one approach, storage elements are programmed in an out of sequence or zigzag word line order. A particular word line is programmed with a coarse program pass, after which another word line is programmed with a fine program pass, after which the particular word line is read. The particular word line is read before another word line is programmed with a coarse program pass which causes coupling interference to storage elements of the particular word line. The read data is subsequently used to perform a fine program pass for the particular word line. This avoids the need to store program data of multiple word lines concurrently, so that storage hardware can be reduced in size along with power consumption.

11 Claims, 19 Drawing Sheets

U.S. PATENT DOCUMENTS

2007/0280000 A1* 12/2007 Fujiu et al. ............... 365/185.24
2008/0019185 A1 1/2008 Li
2008/0019193 A1 1/2008 Li
2008/0025099 A1 1/2008 Li et al.
2008/0137432 A1 6/2008 Lee et al.
2008/0198664 A1 8/2008 Mokhlesi
2008/0253181 A1 10/2008 Edahiro et al.
2009/0185416 A1* 7/2009 Li et al. .................... 365/185.03

OTHER PUBLICATIONS

Response to Office Action dated May 20, 2011, European Patent Application No. 09810897.0.

International Preliminary Report on Patentability dated Mar. 15, 2011, International Application No. PCT/US2009/056394 filed Sep. 9, 2009.

* cited by examiner

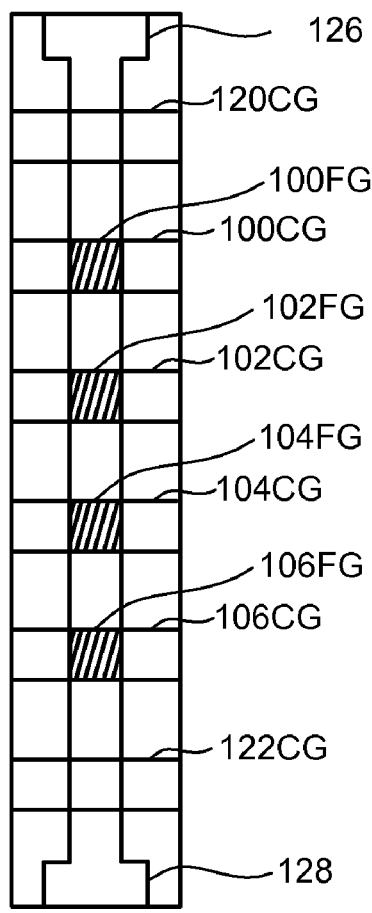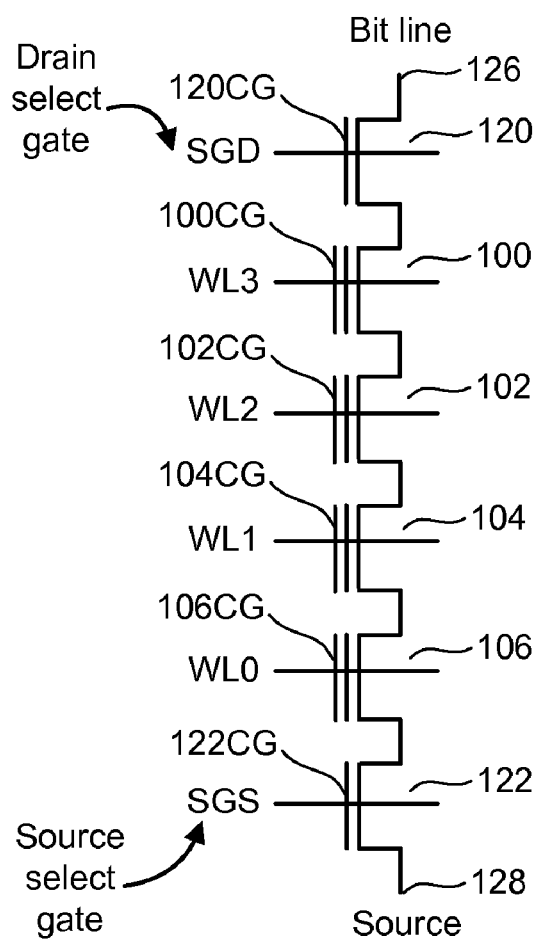

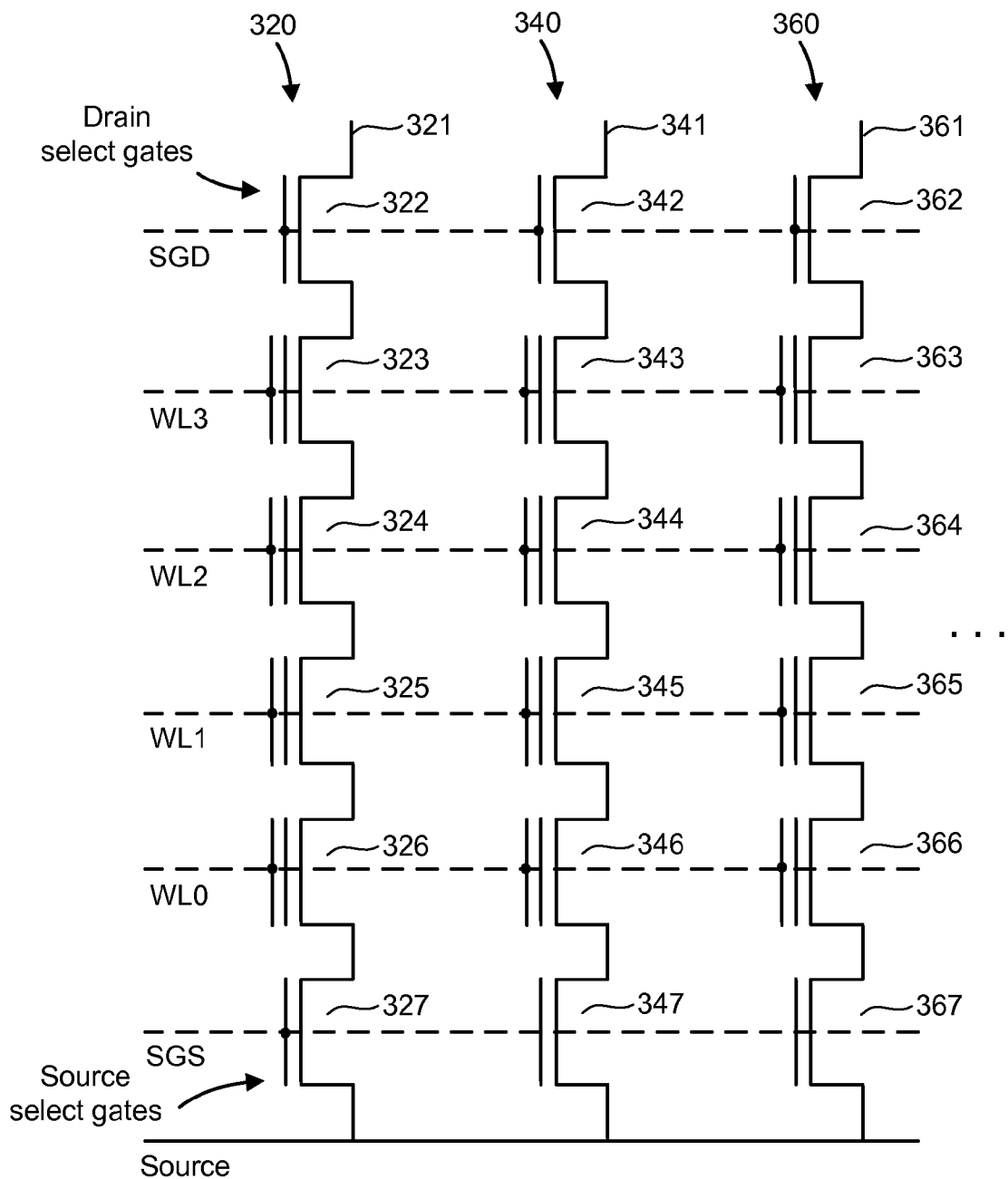

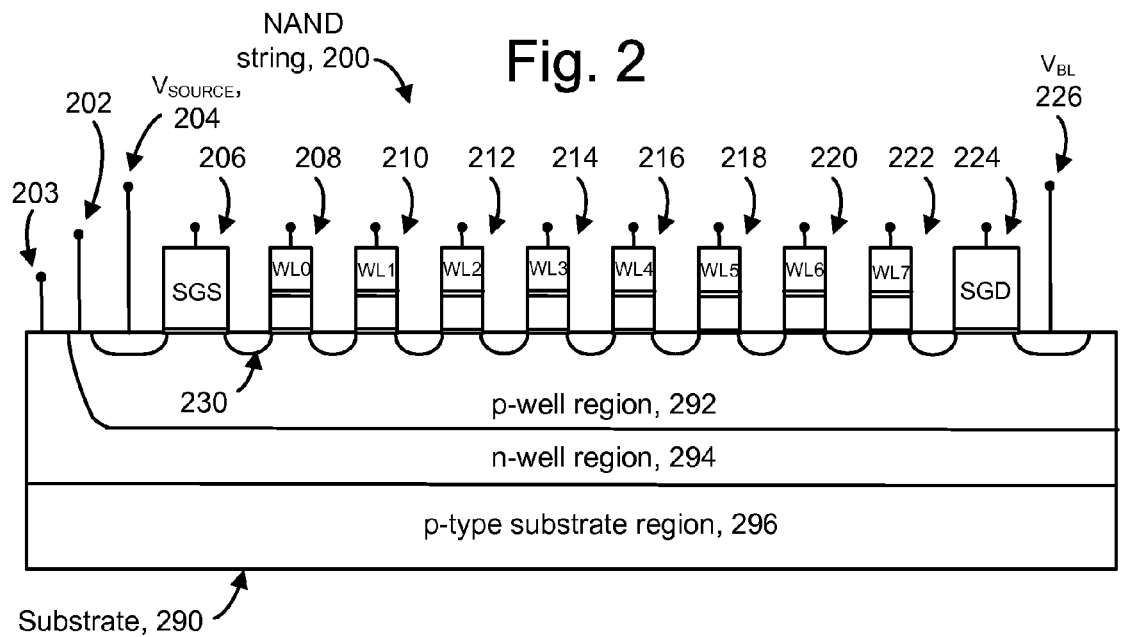
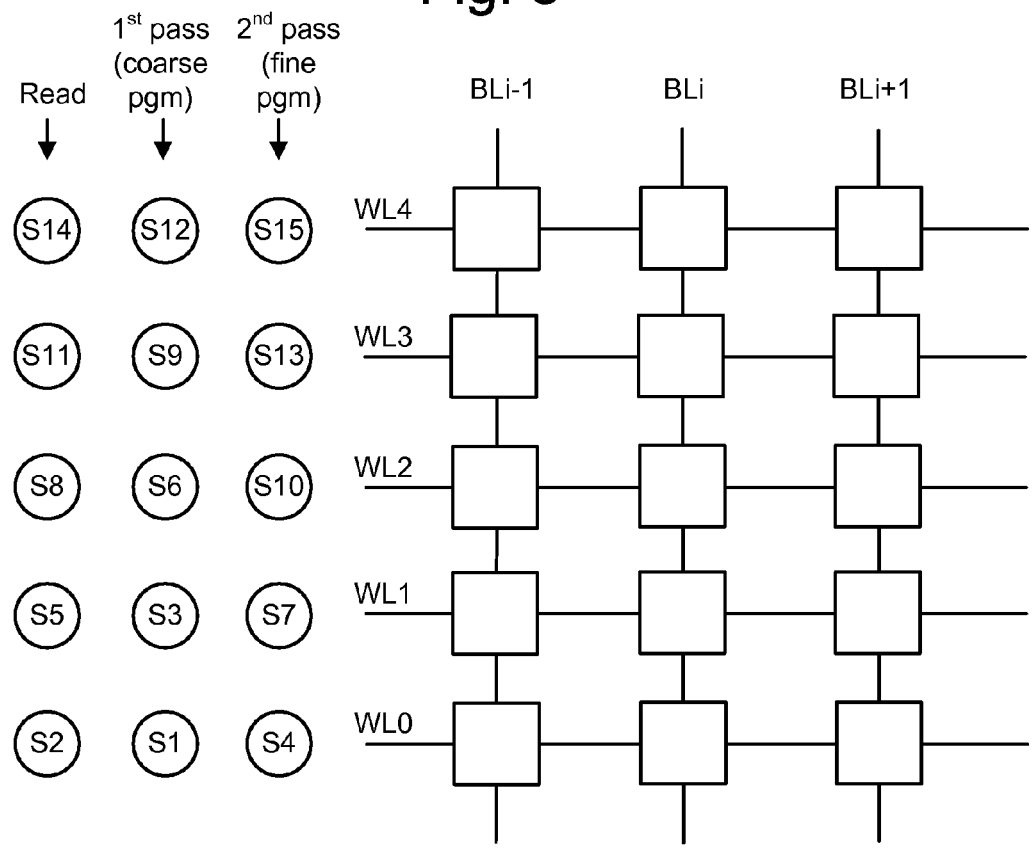

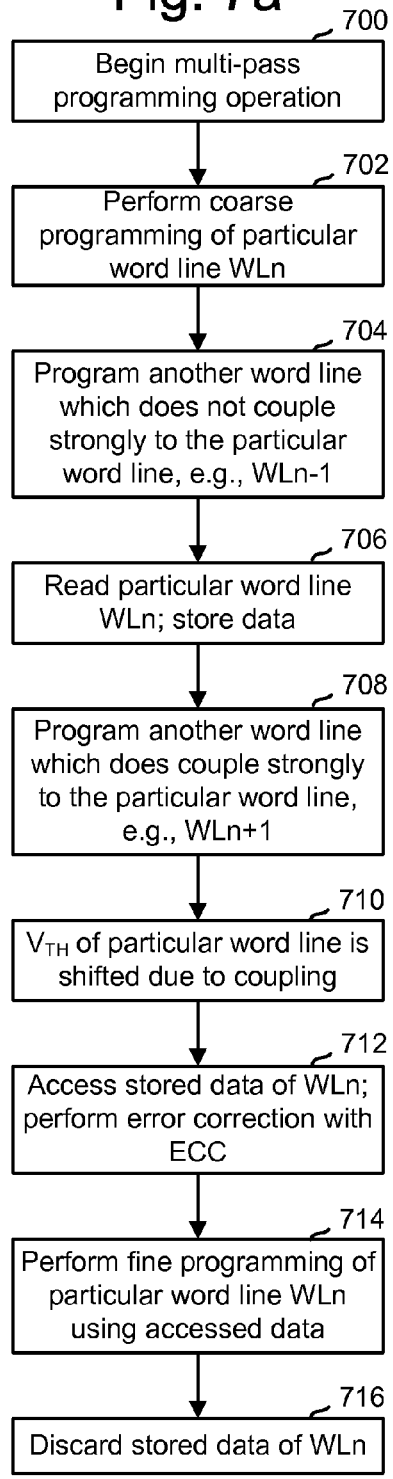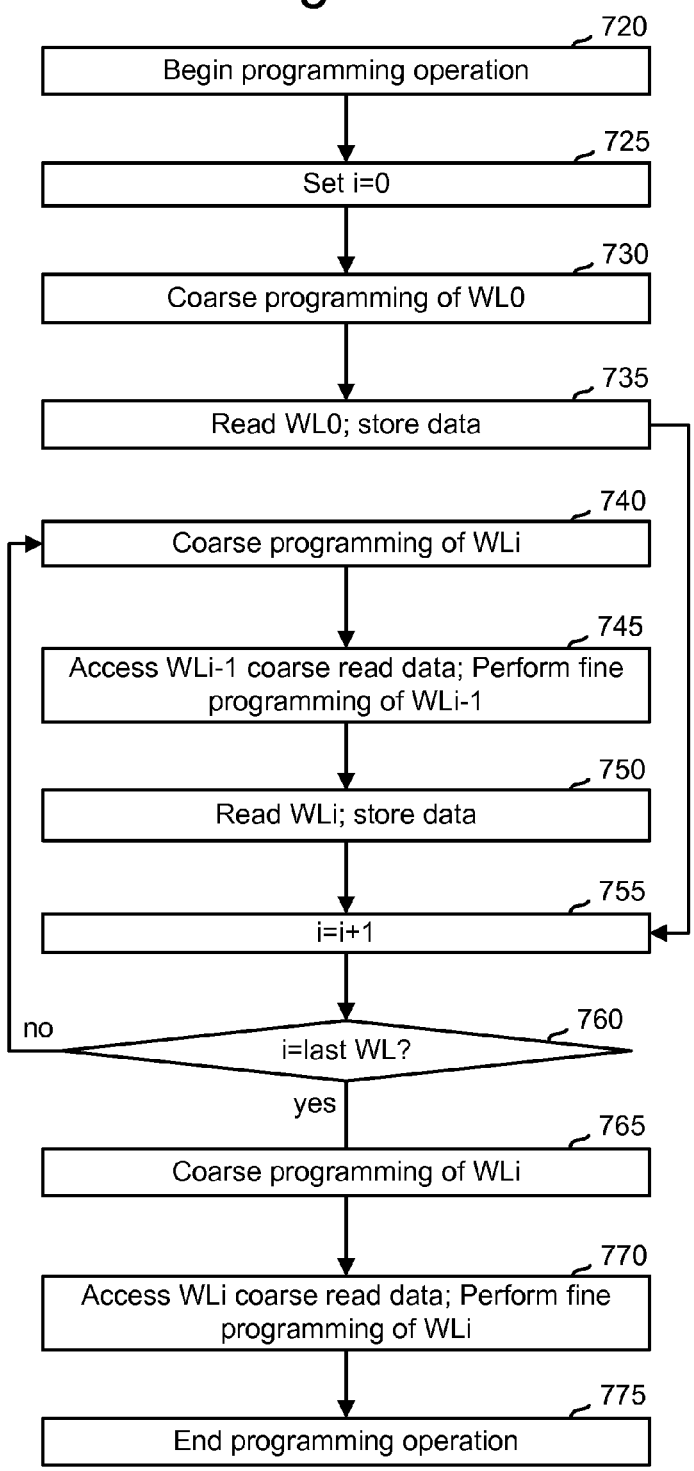

MULTI-PASS PROGRAMMING FOR MEMORY WITH REDUCED DATA STORAGE REQUIREMENT

CROSS-REFERENCE TO RELATED APPLICATIONS

This application claims the benefit of U.S. provisional patent application No. 61/096,221, filed Sep. 11, 2008, and incorporated herein by reference.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self-Boosting Technique For Non-Volatile Memory," and U.S. Pat. No. 6,917,545, titled "Detecting Over Programmed Memory," both of which are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent floating gates. One example of an adjacent floating gate to a target floating gate includes a floating gate that is connected to the same word line and connected to an adjacent bit line.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

The floating gate to floating gate coupling can occur between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The floating gate to floating gate coupling can also occur between sets of adjacent memory cells that have been programmed concurrently. For example, two adjacent multi-state memory cells may be programmed to different target levels such that a first memory cell is programmed to a state corresponding to a lower threshold voltage and a second memory cell is programmed to a state corresponding to a higher threshold voltage. The memory cell being programmed to the state corresponding to the lower threshold voltage is likely to reach that state and be locked out from further programming before the second memory cell reaches the state corresponding to the higher threshold voltage. After the second memory cell reaches the state corresponding to the higher threshold voltage, it will couple to the first memory cell and cause the first memory cell to have a higher apparent threshold voltage than programmed.

As memory cells continue to shrink in size, the natural programming and erase distributions of threshold voltages are expected to increase due to short channel effects, greater oxide thickness/coupling ratio variations and more channel dopant fluctuations, thereby reducing the available separation between adjacent states. This effect is much more significant for multi-state memories than memories using only two states (binary memories). Furthermore, the reduction of the space between word lines and of the space between bit lines will also increase the coupling between adjacent floating gates.

Thus, there is a need to reduce the effects of coupling between adjacent floating gates. Furthermore, due to marketplace competition, any such approach should be cost effective and make efficient use of hardware.

SUMMARY OF THE INVENTION

A programming technique is provided for reducing the effects of coupling between adjacent floating gates in a cost effective manner.

In one embodiment, a method for operating non-volatile storage includes: (a) programming a particular non-volatile storage element to raise its threshold voltage to a first level which is above a first verify level, (b) reading the particular non-volatile storage element after the programming to determine that the threshold voltage has been raised above the first verify level, and (c) responsive to the reading, further programming the particular non-volatile storage element to raise its threshold voltage from the first level to a second level which is above the second verify level.

In another embodiment, a method for operating non-volatile storage includes performing multi-pass programming operations on a set of non-volatile storage elements which is associated with a set of word lines. The multi-pass programming operations include at least two associated programming passes for each word line, and are performed in an order in which a particular word line, WLn, is subject to one programming pass, after which at least a first additional word line is subject to at least one programming pass, after which WLn is subject to another programming pass. The method further includes performing a read operation for WLn after WLn is subject to the one programming pass and before the first additional WL is subject to the one programming pass, and using results from the read operation to perform the associated additional pass of WLn.

In another embodiment, a method for operating non-volatile storage includes performing multi-pass programming operations on a set of non-volatile storage elements which is associated with a set of word lines. The multi-pass programming operations include at least two associated programming passes for each word line, and are performed in an order in which a particular word line, WLn, is subject to one programming pass, after which at least a first additional word line is subject to at least one programming pass which partially programs non-volatile storage elements associated with WLn. The method further includes performing a read operation and an associated error correction process for WLn after WLn is subject to the one programming. The method further includes using results from the read operation and the associated error correction process to perform another programming pass of WLn, thereby completing programming of the non-volatile storage elements associated with WLn.

In another embodiment, a non-volatile storage apparatus includes a set of non-volatile storage elements, and one or more circuits in communication with the set of non-volatile storage elements. The one or more control circuits: (a) program a particular non-volatile storage element to raise its threshold voltage to a first level which is above a first verify level, (b) read the particular non-volatile storage element after the programming to determine that the threshold voltage has been raised above the first verify level, and (c) responsive to the reading, further program the particular non-volatile storage element to raise its threshold voltage from the first level to a second level which is above the second verify level.

Corresponding methods, systems and computer- or processor-readable storage devices which have executable code for performing the methods provided herein may also be provided.

BRIEF DESCRIPTION OF THE DRAWINGS

FIG. 1a is a top view of a NAND string.

FIG. 1b is an equivalent circuit diagram of the NAND string.

FIG. 1c is a block diagram of an array of NAND flash storage elements.

FIG. 2 depicts a cross-sectional view of a NAND string.

FIG. 3 depicts a programming order for a set of storage elements and associated word lines in a two-pass programming technique.

FIG. 7a depicts an overview of a multi-pass programming process in which data is read between programming passes and subsequently accessed and error corrected.

FIG. 7b depicts a multi-pass programming process corresponding to the two-pass programming technique of FIG. 3.

FIGS. 12b-12e depict threshold voltage distributions for a programming technique associated with FIG. 12a.

DETAILED DESCRIPTION

Figure 4A:
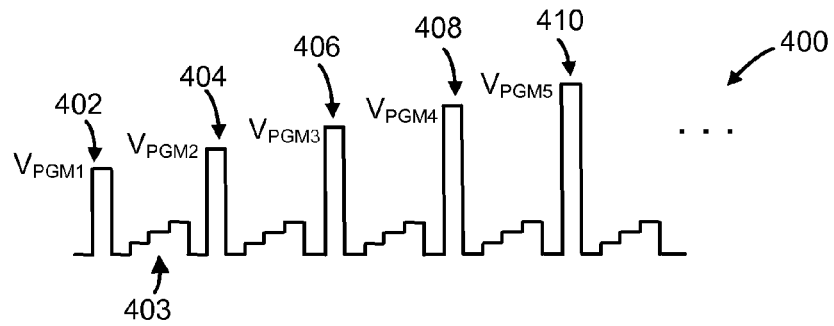
FIG. 4a depicts a first example pulse train applied to the control gates of storage elements during programming.

A programming technique is provided for reducing the effects of coupling between adjacent floating gates in a cost effective manner.

One example of a flash memory system uses the NAND structure, which includes arranging multiple transistors in series, sandwiched between two select gates. The transistors in series and the select gates are referred to as a NAND string. FIG. 1a is a top view showing one NAND string. FIG. 1b is an equivalent circuit thereof. The NAND string depicted in FIGS. 1a and 1b includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1a and 1b show four memory cells in the NAND string, the use of four memory cells is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

FIG. 1c is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth.

These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the $V_{TH}$ ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the VTH of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 1c, the program voltage will also be applied to the control gates of storage elements 344 and 364.

FIG. 2 depicts a cross-sectional view of a NAND string. The view is simplified and not to scale. The NAND string 200 includes a source-side select gate 206, a drain-side select gate 224, and eight storage elements 208, 210, 212, 214, 216, 218, 220 and 222, formed on a substrate 290. The components can be formed on a p-well region 292 which itself is formed in an n-well region 294 of the substrate. The n-well can in turn be formed in a p-substrate 296. Supply lines 202 and 203 may communicate with the p-well region 292 and n-well region 294, respectively. A source supply line 204 with a potential of $V_{SOURCE}$ is provided in addition to a bit line 226 with a potential of $V_{BL}$. $V_{SGS}$ is applied to the select gate 206 and $V_{SGD}$ is applied to the select gate 224. The source side of a word line or non-volatile storage element refers to the side which faces the source end of the NAND string, e.g., at source supply line 204, while the drain side of a word line or non-volatile storage element refers to the side which faces the drain end of the NAND string, e.g., at bit line 226.

It is important to be able to accurately program data into the storage elements in a memory device. Generally, as non-volatile memory devices such as NAND devices have been shrunk down to smaller and smaller dimensions, the spacing between neighboring storage element is also shrinking. This leads to larger capacitive coupling, particularly between floating gates, which means larger interference from neighboring storage elements. Capacitive coupling includes bit line-to-bit line coupling and word line-to-word line coupling.

In order to make the $V_{TH}$ distribution narrower, the interference effects have to be addressed. One solution is multi-pass programming. In one approach, the storage elements are programmed to an offset level below their final intended states in one, coarse pass. This offset level is for a partly programmed state that may be considered to be a coarse or "foggy" state. Subsequently, the storage elements are programmed the remainder of the way to their final intended states in another, fine pass. The final programmed state may be considered to be a "fine" state. One example multi-pass programming technique is discussed next.

FIG. 3 depicts a programming order for a set of storage elements and associated word lines in a two-pass programming technique. Here, a set of storage elements, each represented by a square, is in communication with a set of word lines WL0 to WL4 and a set of bit lines BLi−1 to BLi+1. The components depicted may be a subset of a much larger set of storage elements, word lines and bit lines. In this example, five word lines are provided, where WL0 is a source side end word line and WL4 is a drain side end word line. In practice, many more word lines are typically arranged in a block, such as 64 or 128 word lines. The illustration provided is used to depict aspects of one embodiment of the invention. Steps S1 through S15 denote steps which are performed sequentially.

The programming order may be referred to as a word line out of sequence or zigzag sequence since the order involves jumping back and forth among the word lines. Note that a coarse pass and a fine pass are provided for each word line. A first programming pass is performed for selected storage elements associated with WL0 (this is step 1 or S1). Next, a read operation is performed for WL0 (S2). The read operation allows the condition of the storage elements on WL0 to be ascertained before the storage elements are affected by coupling from subsequent programming of neighboring word line storage elements. Errors in the read data can be detected using an error correction code (ECC). Furthermore, the ECC can be utilized to correct failure bits caused by coarse programming itself, or failure bits caused in the period after the coarse programming and before the coarse read. It is assumed that there are no failure bits caused by the temporal storage.

Subsequently, at S3, a coarse programming pass occurs for WL1. This programming causes a shift in the threshold voltages of the storage elements of WL0 due to coupling from WL1. At S4, a fine programming pass occurs for WL0. To achieve this, the data which was previously read and stored is accessed and decoded using ECC decoding, in one possible implementation. The read data indicates the data states to which each storage element of WL0 is to be programmed in the fine programming pass. After S4, the read data can be deleted. This approach avoids the need to store program data for the fine programming during the coarse programming, for a given word line, as explained in further detail below. Additionally, threshold voltage distributions are tightened.

At S5, a read operation is performed for WL1, and at S6, coarse programming is performed for WL2, which causes a shift in the threshold voltages of the storage elements of WL1 due to coupling. At S7, a fine programming pass occurs for WL1. This could cause a minor amount of coupling to the source side neighboring word line, WL0. However, this coupling is much less than that due to coarse programming and thus can be tolerated. The data which was previously read at S5 is accessed and decoded using ECC decoding. The read data indicates the data states to which each storage element of WL1 is to be programmed in the fine programming pass. The process proceeds accordingly for the other world lines so that, for a given word line, the storage elements are read after the coarse programming, before the word line is subject to coupling from coarse programming of a higher word line, and the read data is used for the fine programming. The last word line, WL4, is programmed analogously except there is no higher word line programmed after the read of S14. Instead, fine programming occurs for WL4 at S15.

Optionally, an additional, initial programming pass may be performed before the coarse and fine programming passes depicted such as discussed in connection with FIG. 8.

In the approach of FIG. 3, a given word line does not complete programming until the next higher word line has been partially programmed. Essentially, the next higher word line is one programming pass behind. For example, when WL0 has completed the fine programming, WL1 has only completed the coarse programming.

All bit line programming may be used in which the storage elements of all bit lines on a word line are programmed without regard to whether the storage elements are associated with an even or odd numbered bit line. However, other approaches are possible, including an approach in which the even bit lines are programmed, undergoing program and verify operations, followed by the odd bit lines being programmed, undergoing program and verify operations. In another approach, the even and odd bit lines are both programmed together, receiving a program pulse, after which the even bit lines are verified, and after which the odd bit line are verified. A next program pulse is subsequently applied and the process proceeds accordingly. These approaches are described next.

FIG. 4a depicts a first example pulse train 400 applied to the control gates of storage elements during programming. The pulse train includes program pulses 402, 404, 406, 408, 410 . . . which step up in amplitude, in one possible approach, and a set of verify pulses between each program pulse, including example verify pulses 403, which have amplitudes such as $V_{VA-COARSE}$, $V_{VB-COARSE}$ and $V_{VC-COARSE}$ or $V_{VA-FINE}$, $V_{VB-FINE}$ and $V_{VC-FINE}$, discussed further below. The pulse amplitudes are $V_{PGM1}$, $V_{PGM2}$, and so forth. The pulses can be fixed in amplitude, or they can step up at a fixed or varying rate, for instance. Typically, m−1 verify pulses are used when m data states are used. In one approach, the same pulse train is used for each programming pass. However, it is also possible to use a different pulse train in the different programming passes. For example, the second programming pass may use a pulse train which starts at a higher initial $V_{PGM}$ than the first pass.

In one embodiment, the programming pulses have a voltage, $V_{PGM1}$, which starts at, e.g., 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses.

The pulse train 400 may be used during all bit line programming, for instance, or during even-odd programming. During one type of even-odd programming, storage elements of even-numbered bit lines are programmed and verified using repeated applications of the pulse train 400, followed by storage elements of odd-numbered bit lines being programmed and verified using repeated applications of the pulse train 400.

Figure 4B:
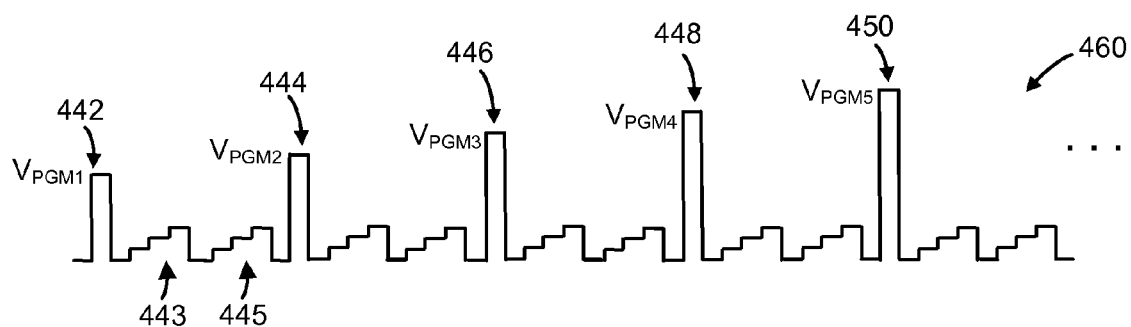
FIG. 4b depicts a second example pulse train applied to the control gates of storage elements during programming.

In another type of even-odd programming, shown in FIG. 4b, storage elements of even- and odd-numbered bit lines are programmed together, but the verify is performed separately. For example, the pulse train 460 includes program pulses 442, 444, 446, 448, 450 . . . which step up in amplitude, and two sets of verify pulses between each program pulse, including example sets 443 and 445. Between program pulses 442 and 444, for instance, the set of verify pulses 443 may be used to verify storage elements of even-numbered bit lines, and the set of verify pulses 445 may be used to verify storage elements of odd-numbered bit lines, in one possible approach.

Figure 4C:
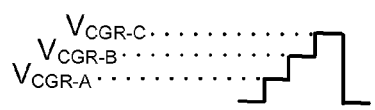
FIG. 4c depicts an example voltage waveform applied to the control gates of non-volatile storage elements during a read operation.

FIG. 4c depicts an example voltage waveform applied to the control gates of non-volatile storage elements during a read operation. During a read operation, the voltage on a selected word line is coupled to the control gates of selected storage elements, and a sequence of read voltages $V_{CGR-A}$, $V_{CGR-B}$ and $V_{CGR-C}$ is provided. A read operation is distinguished from a verify operation in that a verify operation typically uses only one comparison level while a read operation uses multiple comparison levels, for a multi-level storage element. Further, a verify operation involves ensuring that a threshold voltage of a storage elements exceeds a comparison level, while a read operation involves determining which voltage threshold interval and data state a storage element should be classified into. Generally, n−1 read compare levels are used to distinguish among n states. As discussed below in connection with FIGS. 6a and 6b, different read voltages can be used depending on whether coarsely programmed data or finely programmed data is being read.

Figure 5A:
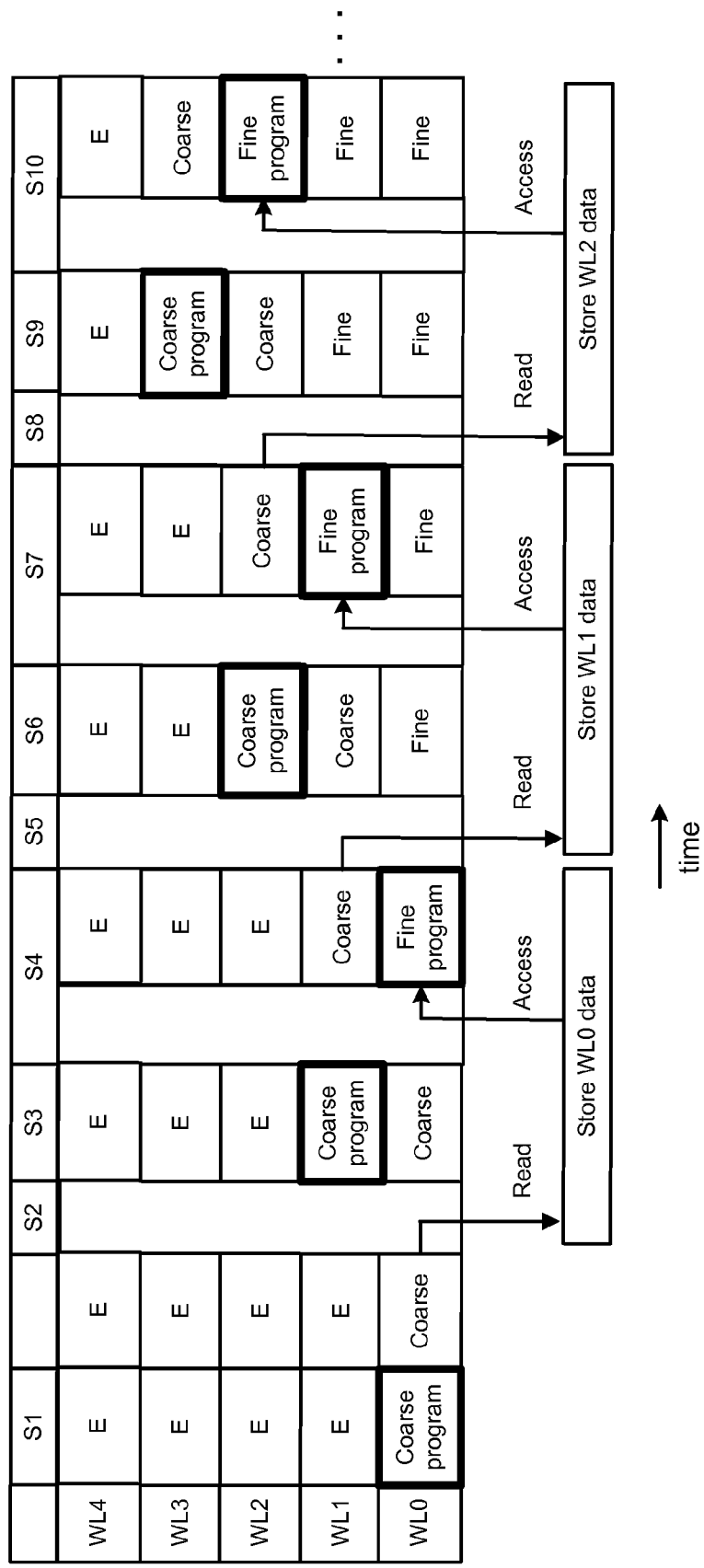
FIG. 5a depicts details of the two-pass programming technique of FIG. 3, where data is read between programming passes.

FIG. 5a depicts details of the two-pass programming technique of FIG. 3, where data is read between programming passes. Steps S1 through S10 correspond to the like numbered steps of FIG. 3. "E" denotes the erased state. Time proceeds to the right. Prior to S1, the storage elements of all word lines are in the erased (E) state. At S1, coarse programming is performed for WL0 ("coarse program"), after which storage elements of WL0 are in a coarsely programmed state ("coarse"). Storage elements of WL1 through WL4 are in the E state. At S2, WL0 is read, and the associated data is stored. For example, two bits of data can be stored for each storage element when there are four possible data states. Generally, N bits are stored when there are $2^N$ states. At S3, coarse programming is performed for WL1. Storage elements of WL1 are in the coarse state, and storage elements of WL2 through WL4 are in the E state.

At S4, the read data for WL0 is accessed for use in fine programming of WL0. Essentially, the read data indicates the data state to which each storage element of WL0 is to be programmed during fine programming. Thus, the coarse threshold voltage distributions provide the program data for the fine distributions. The read data of WL0 can be discarded after the fine programming as it is no longer need. Note that read data from only one word line need be stored at a time. This reduces the storage requirements for program data as well as operations needed for moving data around, thus allowing possible reductions in hardware costs, power consumption and the space used by the hardware on the memory chip.

The reading, storing and subsequent accessing of data can be implemented as a sequence which is launched by a command input, and a storage location in the memory device can be provided to temporarily store the read data. The multi-pass programming will be transparent to the user. Additionally, the storage location in the memory device can be volatile since the command guarantees that the reading, storing and subsequent accessing of data is continuous.

The techniques herein provide a coarse-fine program method which requires less capacity of data storage. The conventional coarse/fine programming method for 4-level storage elements requires storage such as 4-bit flip-flops (not necessarily flip-flops, any storage is acceptable) per bit line to keep program data. On the other hand, the 4-level cell of the technology described herein only requires storage such as 2-bit flip-flops (not necessarily flip-flops, any storage is acceptable) per bit line.

At S5, WL1 is read, and the associated data is stored. At S6, coarse programming is performed for WL2. Generally, a coarse distribution on WLn−1 is read before coarse programming on WLn. The coarse distribution on WLn−1 is only minimally disturbed by coupling from the fine programming on WLn−2. During S6, storage elements of WL0 are in the fine state, storage elements of WL1 are in the coarse state, and storage elements of WL3 and WL4 are in the E state. At S7, the read data for WL1 is accessed for use in fine programming of WL1. The read data of WL1 can be discarded after the fine programming. At S8, WL2 is read, and the associated data is stored. At S9, coarse programming is performed for WL3. Storage elements of WL0 and WL1 are in the fine state, storage elements of WL2 are in the coarse state, and storage elements of WL4 are in the E state. At S10, the read data for WL2 is accessed for use in fine programming of WL2. The read data of WL2 can be discarded after the fine programming. Additional steps which are not depicted are subsequently performed.

Note that an overhead cost of adding the read operation to the multi-pass programming is incurred by the time to read the coarse distributions. However, this cost is low, as the read time is typically a small fraction of the total programming time.

Figure 5B:
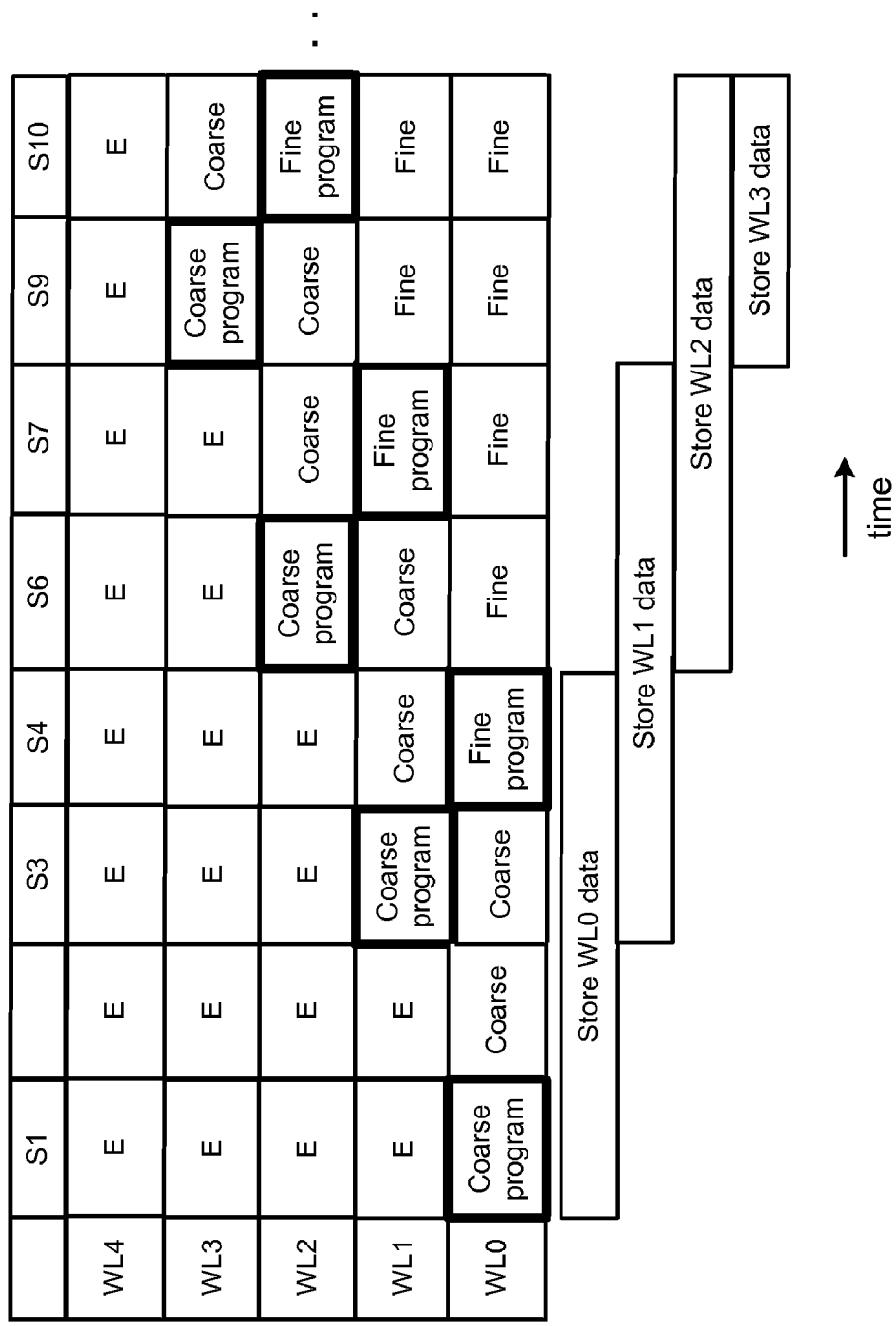
FIG. 5b depicts details of a two-pass programming technique where data is not read between programming passes.

FIG. 5b depicts details of a two-pass programming technique where data is not read between programming passes, as a comparison to FIG. 5a. Steps S1, S3, S4, S6, S7, S9 and S10 correspond to the like numbered steps in FIG. 5a. In this approach, program data from at least two word lines needs to be stored concurrently, somewhere in the memory device or storage system. For example, data of WL0 is stored from when coarse programming is performed (S1) until fine programming is performed for WL0 (S4). Data of WL1 is stored from when coarse programming is performed (S3) until fine programming is performed for WL1 (S7). Data of WL2 is stored from when coarse programming is performed (S6) until fine programming is performed for WL2 (S10), and so on. Thus, WL0 and WL1 are stored at the same time, WL1 and WL2 are stored at the same time, WL2 and WL3 are stored at the same time, and so forth.

Figure 6A:
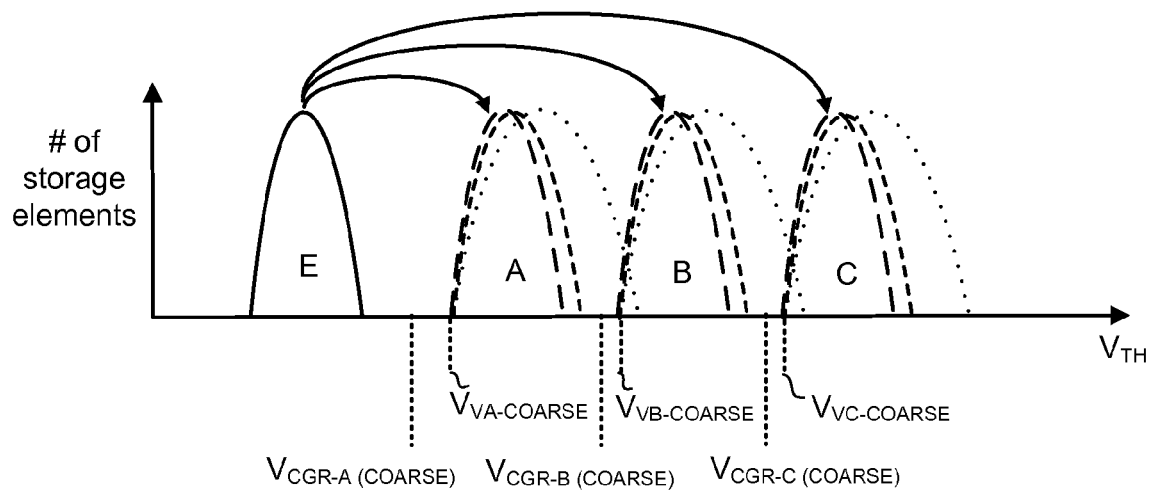
FIG. 6a depicts changes in threshold voltages after a first, coarse pass of the two-pass programming technique of FIG. 3.

FIG. 6a depicts changes in threshold voltages after a first, coarse pass of the two-pass programming technique of FIG. 3. This programming technique is referred to as full sequence programming. This portion of the programming technique uses lower or coarse verify voltages.

Coarse programming refers to the fact that storage elements are programmed toward their final intended state with a lesser degree of precision and at a faster rate (a greater $\Delta V_{TH}$/sec.) than fine programming. This faster programming can be achieved, e.g., by applying program pulses having a higher amplitude, or increasing at a faster rate. The storage elements are programmed to a verify level which is offset below the final, or fine, verify level. The coarse verify level is generally close to the fine verify level, but low enough to prevent the storage elements from overshooting too far past the fine verify level. That is, the cells are allowed to program beyond the fine verify level as depicted, although programming the cells too far past the fine verify level will result in a widening of the fine distribution.

As an example, there can be four data states, including an erased state (E) and three higher states A, B and C. Any number of states can be used, including two, four, eight, sixteen or more. The storage elements are initially in the E state. A first, coarse programming pass uses a first, coarse set of verify voltages $V_{VA\text{-}COARSE}$, $V_{VB\text{-}COARSE}$, and $V_{VC\text{-}COARSE}$ for states A, B and C, respectively. The coarse programming pass is alternatively referred to as a first pass of a multiple "pass write" (PW) programming process. Just after the coarse programming pass, the storage elements which are associated with a given word line, WLn, for instance, have $V_{TH}$ distributions which are represented by the long dashed lines. The transition in threshold voltage on WLn is relatively large, resulting in coupling to storage elements of an adjacent word line. After fine programming on the adjacent source side word line, WLn−1, the $V_{TH}$ distributions for WLn are shifted slightly higher as represented by the short dashed lines. After coarse programming on the adjacent drain side word line, WLn+1, the $V_{TH}$ distributions for WLn are shifted significantly higher as represented by the dotted lines. The coupling effect of coarse programming is thus stronger than that of fine programming.

Figure 6B:
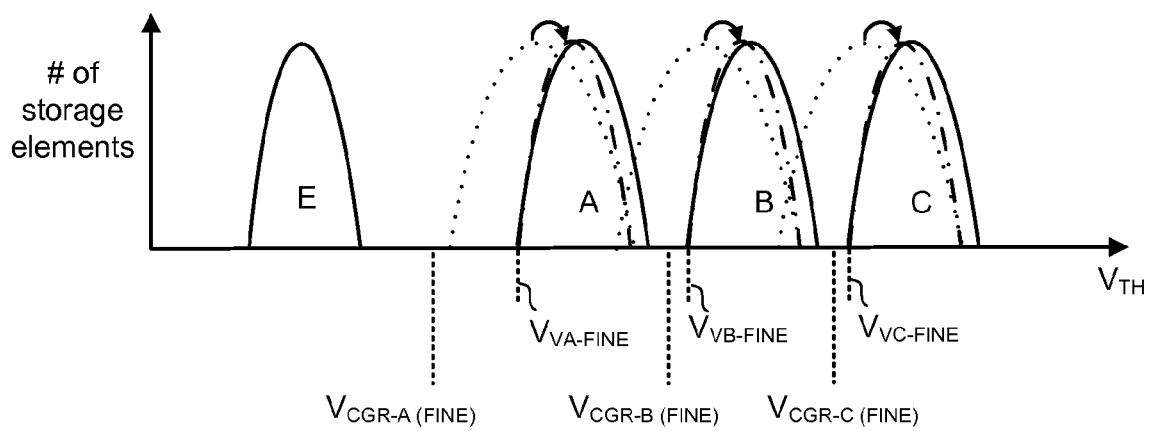
FIG. 6b depicts changes in threshold voltages after a second, fine pass of the two-pass programming technique of FIG. 3.

Coarse distributions on WLn after fine programming on WLn−1 will have some read margin, e.g., the distributions do not overlap. Thus, reading the coarse distributions on WLn after fine programming on WLn−1 (reading the distribution represented by the short dashed lines) will result in accurate results. In case ECC is used, a certain amount of overlap of the distributions can be allowed while the ECC can be used to correct fail bits. The optimal read levels for reading the coarse distribution should be somewhat lower than for the fine distribution. For example, the read levels for the coarse distribution are $V_{CGR\text{-}A\ (COARSE)}$, $V_{CGR\text{-}B\ (COARSE)}$, and $V_{CGR\text{-}C\ (COARSE)}$, as depicted in FIG. 6a, and the read levels for the fine distribution are $V_{CGR\text{-}A\ (FINE)}$, $V_{CGR\text{-}B\ (FINE)}$, and $V_{CGR\text{-}C\ (FINE)}$, as depicted in FIG. 6b. Coarse distributions on WLn after coarse programming on WLn+1 may not have a good read margin, e.g., the distributions can overlap, as indicated.

FIG. 6b depicts changes in threshold voltages after a second, fine pass of the two-pass programming technique of FIG. 3. The second, fine programming pass, which follows the coarse pass of FIG. 6a, uses a second, higher set of verify voltages $V_{VA\text{-}FINE}$, $V_{VB\text{-}FINE}$, and $V_{VC\text{-}FINE}$ for states A, B and C, respectively. Thus, each nth verify voltage in the second set of verify voltages is higher than each nth verify voltage in the first set of verify voltages by an increment, which can be the same or different for the different states. This is a second pass of the multiple "pass write" programming process. Just after the second programming pass, which is the fine programming pass of WLn, the storage elements have $V_{TH}$ distributions which are represented by the dash-dot lines. The distributions of FIG. 6a which were represented by dotted lines are repeated in FIG. 6b for reference, with arrows indicating how the distributions are narrowed. Here, the storage elements have been programmed to their final intended states. However, after fine programming on WLn+1, the $V_{TH}$ distributions for WLn are shifted slightly higher as represented by the solid lines.

Fine programming refers to the fact that storage elements are programmed toward their final intended state with a higher degree of precision and at a slower rate (a smaller $\Delta V_{TH}$/sec.) than coarse programming. This slower programming can be achieved, e.g., by applying program pulses which have a lower amplitude or increase at a slower rate.

FIG. 7a depicts an overview of a multi-pass programming process in which data is read between programming passes and subsequently accessed and error corrected. Initially, the data which is to be programmed can be in a form which is ECC coded. Generally an error correcting code, which detects and corrects errors, or an error detecting code, which detects but does not correct errors, can be used. A multi-pass programming operation begins at step 700. At step 702, coarse programming is performed for a particular word line, e.g., WLn. At step 704, programming is performed on another word line, e.g., WLn−1, which does not couple strongly to the particular word line. For example, this programming could be fine programming on WLn−1. At step 706, the particular word line is read and the associated data is stored. At step 708, programming is performed for another word line which does result in appreciable coupling to the particular word line. For example, this programming could be coarse programming of WLn+1. Specifically, at step 710, the $V_{TH}$ of the storage elements of the particular word line is shifted due to the coupling.

Step 712 includes accessing the stored data of WLn and performing an error correction process using the ECC. Fine programming is performed for the particular word line using the accessed data at step 714, and the stored data for the particular word line is discarded at step 716. For example, the data can be written over as it is no longer needed.

FIG. 7b depicts a multi-pass programming process corresponding to the two-pass programming technique of FIG. 3. The programming operation begins at step 720. At step 725 a word line index is set to 0, which represents the first word line. The word lines are typically numbered sequentially starting at 0 at the source side of a set of word lines such as a NAND string. Step 730 includes coarse programming of WL0, and step 735 includes reading WL0. Step 755 increments the index, e.g., to 1. If the index is not at the last word line at decision step 760, the flow proceeds to step 740, which includes coarse programming of WLi (e.g., WL1), and step 745 includes accessing WLi−1 (e.g., WL0) coarse read data and performing fine programming of WLi−1. Step 750 includes reading WLi (e.g., WL1) and storing the associated data.

Step 755 increments the index again, e.g., to 2. If the index is not at the last word line at decision step 760, the flow proceeds to step 740, which includes coarse programming of WLi (e.g., WL2), and step 745 includes accessing WLi−1 (e.g., WL1) coarse read data and performing fine programming of WLi−1. Step 750 includes reading WLi (e.g., WL2) and storing the associated data.

The process proceeds accordingly until the index is at the last word line at decision step 760. In the example of FIG. 3, the last word line is represented by i=4. At this point, the programming is modified slightly due to the fact that there is no higher word line than the last word line. At step 765, coarse programming of WLi (e.g., WL4) occurs. At step 770, the WLi (e.g., WL4) coarse read data is accessed and fine programming is performed for WLi. The programming operation finally ends at step 775. Note that this is one example programming sequence, as other programming sequences are possible.

Figure 8:
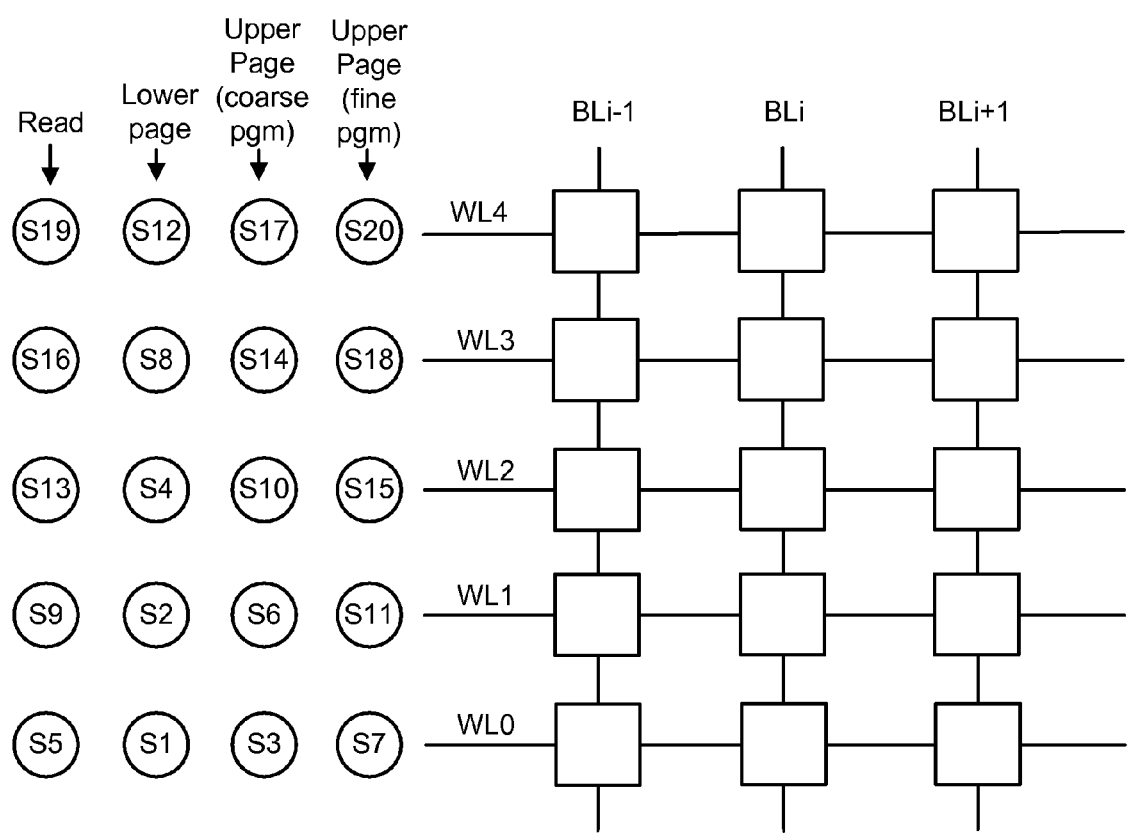
FIG. 8 depicts a programming order for a set of storage elements and associated word lines in a three-pass programming technique.

FIG. 8 depicts a programming order for a set of storage elements and associated word lines in a three-pass programming technique. As with FIG. 3, a set of storage elements, each represented by a square, is in communication with an example set of word lines WL0 to WL4 and an example set of bit lines BLi−1 to BLi+1. The components depicted may be a subset of a much larger set of storage elements, word lines and bit lines. In this example, five word lines are provided, where WL0 is a source side end word line and WL4 is a drain side end word line. That is WL0 is at the source end of a set of series-connected storage elements such as a NAND string, and WL4 is at the drain end of the set of series-connected storage elements. The illustration provided is used to depict aspects of one embodiment of the invention. Steps S1 through S20 denote operations which occur sequentially.

The three passes of the programming are a lower page pass, an upper page coarse pass (or a first upper page pass) and an upper page fine pass (or a second upper page pass), described further below. S1 includes lower page programming of WL0, S2 includes lower page programming of WL1, S3 includes upper page coarse programming of WL0, S4 includes lower page programming of WL2 and S5 includes reading WL0. S6 includes upper page coarse programming of WL1, which causes coupling interference to WL0. S7 include accessing the previously read data and performing upper page fine programming of WL0. S8 includes lower page programming of WL3. S9 includes reading WL1. S10 includes upper page coarse programming of WL2, which causes coupling interference to WL1. S11 includes accessing the previously read data and performing upper page fine programming of WL1. The process proceeds accordingly until the last word line is reached.

In this approach, a given word line does not complete programming until the next two higher word line have been partially programmed. Essentially, the next higher word line is one programming pass behind, and the second higher word line is two programming passes behind. For example, when WL0 has completed the upper page fine programming, WL1 has only completed the upper page coarse programming and WL2 has only completed the lower page programming.

Figure 9:
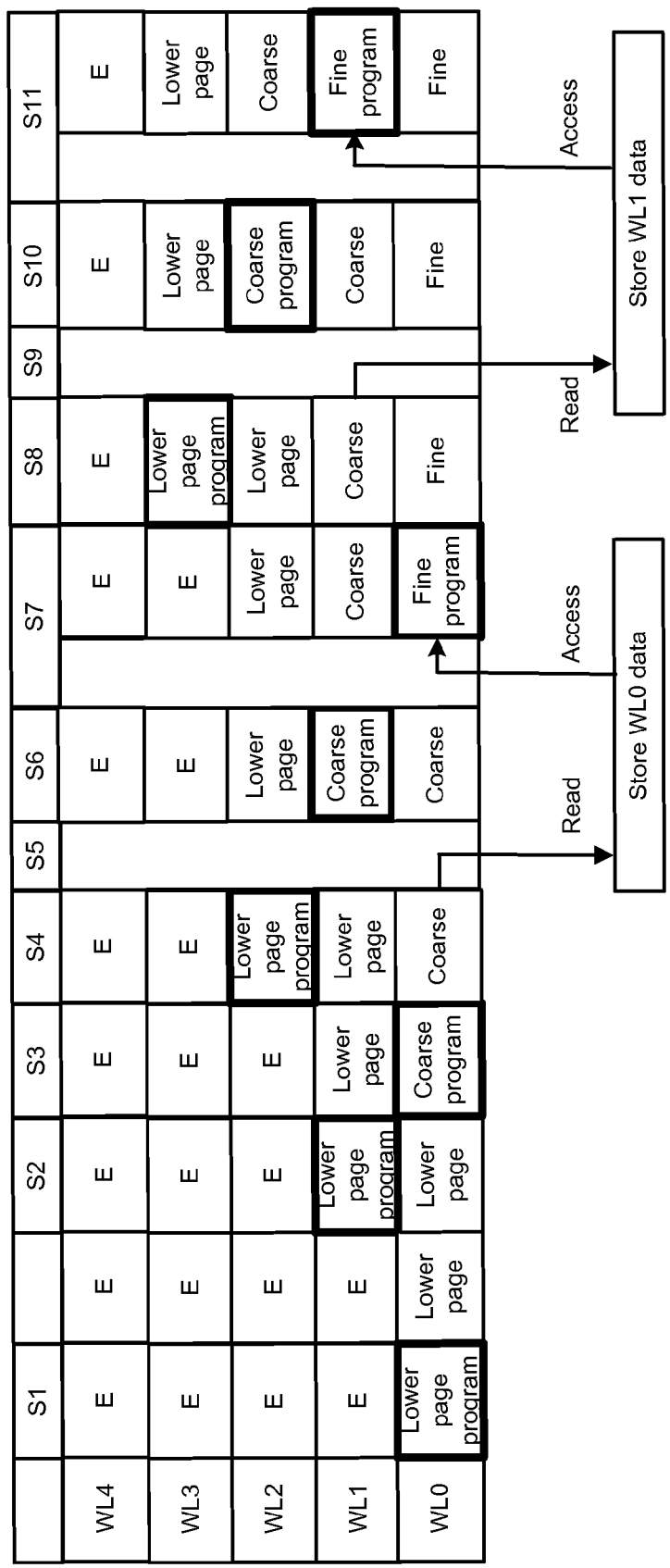
FIG. 9 depicts details of the three-pass programming technique of FIG. 8, where data is read between programming passes.

FIG. 9 depicts details of the three-pass programming technique of FIG. 8, where data is read between programming passes. Steps S1 through S11 correspond to the like numbered steps of FIG. 8. "E" denotes the erased state. Time proceeds to the right. Prior to S1, the storage elements of all word lines are in the erased state (E). At S1, lower page programming ("is performed for WL0, after which storage elements of WL0 are in a lower page state ("lower page"). The lower page programming is also two-level programming when the storage elements are in one of two possible states.

Storage elements of WL1 through WL4 are in the E state. At S2, lower page programming is performed for WL1, after which storage elements of WL1 are in the lower page state. Storage elements of WL0 are in a lower page state and WL2 through WL4 are in the E state. At S3, WL0 undergoes upper page coarse programming ("coarse program"). Storage elements of WL1 are in a lower page state and WL2 through WL4 are in the E state. At S4, lower page programming is performed for WL2, after which storage elements of WL2 are in the lower page state. Storage elements of WL0 are in a coarse state, storage elements of WL1 are in a lower page state and storage elements of WL3 through WL4 are in the E state.

At S5, WL0 is read and the associated data is stored. At S6, coarse programming occurs for WL1. Storage elements of WL0 are in a coarse state, storage elements of WL2 are in a lower page state and storage elements of WL3 through WL4 are in the E state. At S7, the WL0 data is accessed and use for fine programming of WL0. The WL0 data can then be discarded. At S8, lower page programming occurs for WL3. Storage elements of WL0 are in a fine, upper page state, storage elements of WL2 are in a coarse, upper page state and storage elements of WL4 are in the E state. At S9, WL1 is read and the associated data is stored. At S10, coarse programming occurs for WL2. Storage elements of WL0 are in a fine, upper page state, storage elements of WL2 are in a coarse, upper page state, storage elements of WL3 are in a lower page state and storage elements of WL4 are in the E state. At S11, WL1 undergoes fine programming and the read data of WL1 can be discarded. Again, note that read data from only one word line need be stored at a time. This reduces storage requirements as well as operations needed for moving data around.

For example, for a four-level storage element, without the read operation as discussed herein, in one possible implementation, a work area of the programming requires two bits of storage, and a temporal buffer for the subsequent operations requires four bits of storage, including two bits for WLn+1 data to be used for fine programming, and two bits for WLn data to be used for fine programming. Thus, a total of six bits storage space for each storage element is needed. The work area can be provided by data latches or flop flops, for example, while the temporal buffer can be provided by data latches, flop flops, a binary buffer or a binary memory. See FIGS. 14 and 15 for further details. In contrast, with the read operation as discussed herein, the work area for programming requires two bits of storage, and the temporal buffer requires two bits of storage, including two bits for WLn data to be used for fine programming. Thus, a total of four bits storage space for each storage element is needed. A savings of two bits per storage elements results with the programming technique discussed herein.

In another possible implementation, the work area requires three bits of storage, and a temporal buffer for the subsequent operations requires two bits of storage, including two bits for WLn data to be used for fine programming. Thus, a total of five bits storage space for each storage element is needed. In contrast, a savings of one bit per storage elements results with the programming technique discussed herein.

With hundreds or thousands of storage elements in a word line, the savings in storage requirements is significant. A memory device can be designed with the reduced storage requirements in mind to save costs. Further, power consumption can be reduced.

Note that additional steps which are not depicted are also subsequently performed.

Figure 10A:
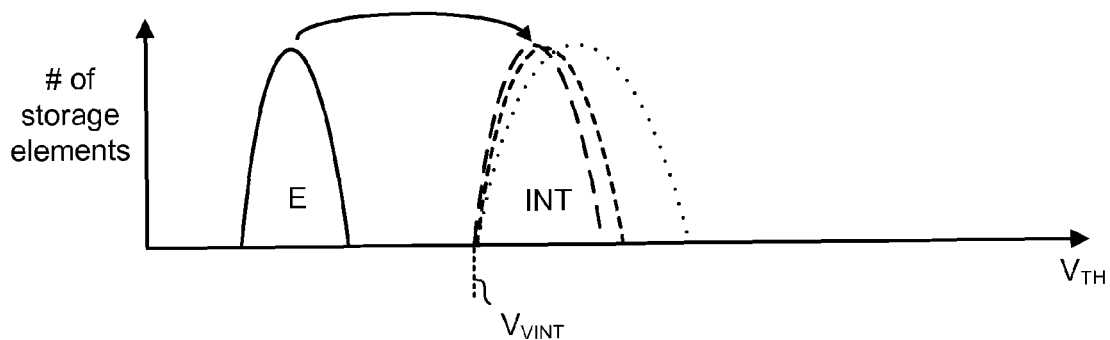
FIGS. 10a-10c depict threshold voltage distributions for a three-pass programming technique associated with FIG. 8.
Figure 10B:
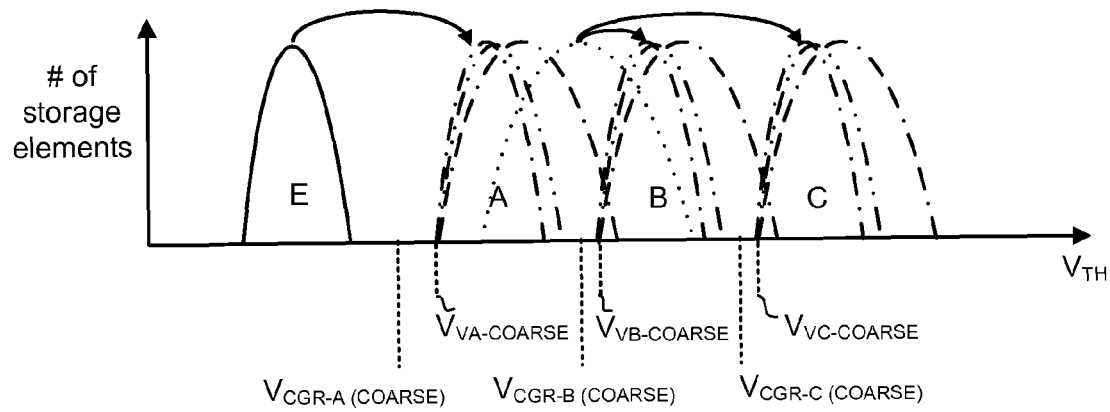
Figure 10C:
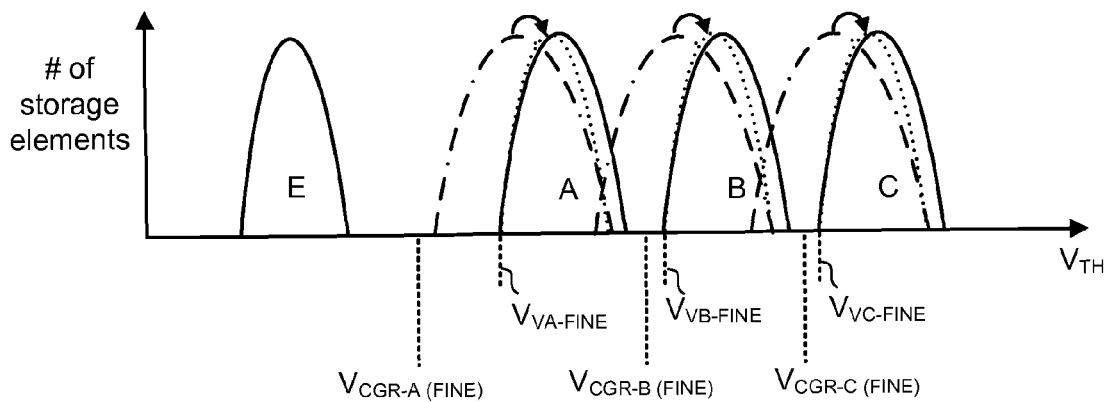

FIGS. 10*a*-10*c* depict threshold voltage distributions for a three-pass programming technique associated with FIG. 8.

FIG. 10*a* depicts changes in threshold voltages after a first, lower page programming pass, in which an intermediate verify voltage is used. Here, the programming process occurs in three phases. An initial phase involves programming using an intermediate verify voltage, $V_{VINT}$, for storage elements which are intended to be programmed to a final state of B or C. Storage elements which are intended to be programmed to a final state of A remain in the erased state. This initial phase may involve programming a lower page of data. Just after lower page programming of WLn, the INT $V_{TH}$ distributions for WLn is represented by the long dashed line for the INT distribution. After coarse programming on WLn−1, the INT $V_{TH}$ distribution is shifted slightly higher as represented by the short dashed line. After coarse programming on WLn+1, the INT $V_{TH}$ distribution for WLn is shifted significantly higher as represented by the dotted line.

FIG. 10b depicts changes in threshold voltages after a second pass, which is a coarse upper page pass, in which lower verify voltages are used. After the initial phase of FIG. 10a, a first "pass write" programming pass uses the first, lower set of verify voltages $V_{VA\text{-}COARSE}$, $V_{VB\text{-}COARSE}$, and $V_{VC\text{-}COARSE}$ for states A, B and C, respectively. Storage elements which are intended to be programmed to a final state A are programmed starting from state E, and storage elements which are intended to be programmed to a final state B or C are programmed starting from state INT. The dotted line of FIG. 10a is repeated in FIG. 10b for reference. The storage elements are programmed to a level which is offset lower than the final state. This programming phase may be a first, coarse pass of programming an upper page of data.

Just after the coarse upper page programming pass of WLn, the storage elements of WLn, for instance, have $V_{TH}$ distributions which are represented by the dash-dot lines. After fine programming on WLn−1, the $V_{TH}$ distributions for WLn are shifted slightly higher as represented by the dash-dot-dot lines. After coarse programming on WLn+1, the $V_{TH}$ distributions for WLn are shifted significantly higher as represented by the dash-dash-dot lines. The read levels for the coarse upper page distribution are $V_{CGR\text{-}A\ (COARSE)}$, $V_{CGR\text{-}B\ (COARSE)}$, and $V_{CGR\text{-}C\ (COARSE)}$. Example control gate read voltages $V_{CGR\text{-}A\ (COARSE)}$, $V_{CGR\text{-}B\ (COARSE)}$ and $V_{GCR\text{-}C\ (COARSE)}$ for states A, B and C, respectively, are also depicted for reference.

FIG. 10c depicts changes in threshold voltages after a third, fine upper page pass, in which higher verify voltages are used. The transition from FIG. 10b to FIG. 10c is similar to the transition from FIG. 6a to FIG. 6b. After the first "pass write" programming pass of FIG. 10b, a second "pass write" programming pass uses the second, higher set of verify voltages $V_{VA\text{-}FINE}$, $V_{VB\text{-}FINE}$, and $V_{VC\text{-}FINE}$ for states A, B and C, respectively. Storage elements which are intended to be programmed to a final state A, B or C are programmed starting from the respective lower offset states, represented by the dash-dash-dot lines which are repeated from FIG. 10b. Example control gate read voltages $V_{CGR\text{-}A\ (FINE)}$, $V_{CGR\text{-}B\ (FINE)}$ and $V_{GCR\text{-}C\ (FINE)}$ for states A, B and C, respectively, are also depicted for reference. This programming phase may be a second, fine pass of programming an upper page of data.

Just after the fine upper page programming pass of WLn, the storage elements have $V_{TH}$ distributions which are represented by the dotted lines. The distribution of FIG. 10b which was represented by a dash-dash-dot line is repeated in FIG. 10c for reference, with arrows indicating how the distributions are narrowed. After fine programming on WLn+1, the $V_{TH}$ distributions for WLn are shifted slightly higher as represented by the solid lines.

Further details of an example multi-pass programming technique are discussed next. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

In an initial programming pass, the lower page is programmed. If the lower page is to remain data 1, then the storage element state remains at state E. If the data is to be programmed to 0, then the threshold of voltage of the storage element is raised such that the storage element is programmed to state INT. In one embodiment, after a storage element is programmed from state E to state INT, its neighbor storage element (WLn+1) in the NAND string will then be programmed with respect to its lower page. For example, looking back at FIG. 1b, after the lower page for storage element 106 is programmed, the lower page for storage element 104 would be programmed. After programming storage element 104, the floating gate to floating gate coupling effect will raise the apparent $V_{TH}$ of storage element 106 if storage element 104 had a $V_{TH}$ raised from state E to state INT. This will have the effect of widening the $V_{TH}$ distribution for state INT. This apparent widening of the $V_{TH}$ distribution will be mostly remedied when programming the upper page.

If the storage element is in state E and the upper page is to remain at 1, then the storage element will remain in state E. If the storage element is in state E and its upper page data is to be programmed to 0, then the $V_{TH}$ of the storage element will be raised so that the storage element is in state A. If the storage element was in the INT threshold voltage distribution and the upper page data is to remain at 1, then the storage element will be programmed to final state B. If the storage element is the INT threshold voltage distribution and the upper page data is to become data 0, then the $V_{TH}$ of the storage element will be raised so that the storage element is in state C. An example of an alternate state coding is to move from distribution INT to state C when the upper page data is a 1, and to move to state B when the upper page data is a 0.

Although FIGS. 10a-c provide an example with respect to four data states and two pages of data, the concepts taught can be applied to other implementations with any number of states and pages.

Figure 11:
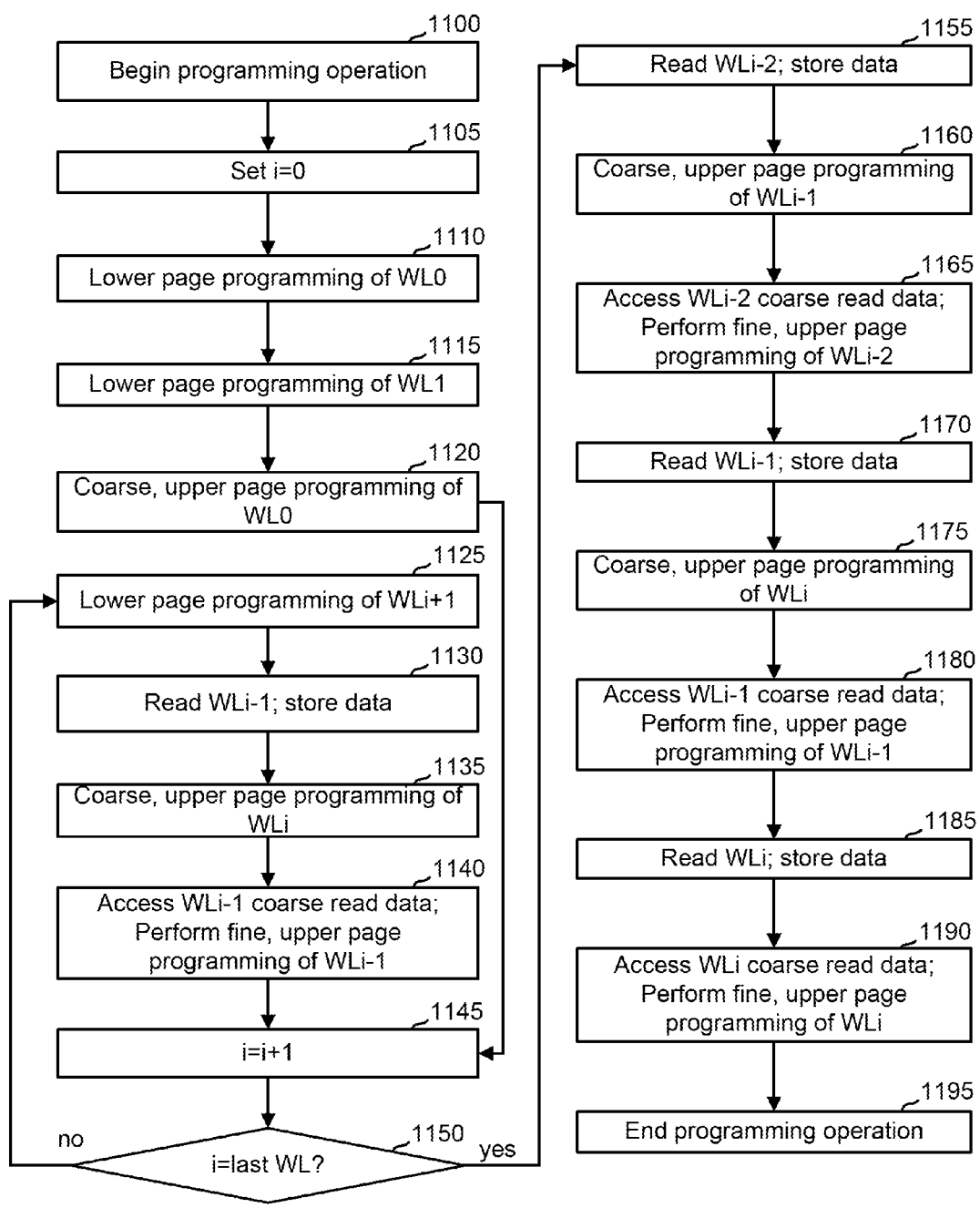
FIG. 11 depicts a multi-pass programming process corresponding to the three-pass programming technique of FIG. 8.

FIG. 11 depicts a multi-pass programming process corresponding to the three-pass programming technique of FIG. 8. The programming operation begins at step 1100. At step 1105, a word line index is set to zero to represent the initial, source side word line. Step 1110 includes lower page programming of WL0. Step 1115 includes lower page programming of WL1. Step 1120 includes coarse, upper page programming of WL0. Step 1145 increments the index, e.g., to i=1 the first time. If the index of the last word has not been reached at decision step 1150, the process of steps 1125 to 1145 are performed. Specifically, step 1125 includes lower page programming of WLi+1 (e.g., WL2), step 1130 includes reading WLi−1 (e.g., WL0) and storing the associated data, and step 1135 includes coarse programming of WLi (e.g., WL1). Step 1140 includes accessing the WLi−1 (e.g., WL0) coarse read data and performing fine, upper page programming of WLi−1. Step 1145 increments the index to i=2 and the process of steps 1125 to 1145 is again performed. Specifically, step 1125 includes lower page programming of WLi+1 (e.g., WL3), step 1130 includes reading WLi−1 (e.g., WL1) and storing the associated data, and step 1135 includes coarse programming of WLi (e.g., WL2). Step 1140 includes accessing the WLi−1 (e.g., WL1) coarse read data and performing fine, upper page programming of WLi−1.

The index is incremented again at step 1145 and steps 1125 to 1145 are again performed until the last word line is reached at decision step 1150. At this point, steps 1155 to 1190 are performed, which involve concluding the programming process for the last few word lines. For example, with i=4 for the last word line, as depicted in FIG. 8, as an illustration only, step 1155 includes reading WLi−2 (e.g., WL2), step 1160 includes coarse, upper page programming of WLi−1 (e.g., WL3), and step 1165 includes accessing WLi−2 (e.g., WL2) coarse read data and using it to perform fine programming of WLi−2. Step 1170 includes reading WLi−1 (e.g., WL3), step 1175 includes coarse, upper page programming of WLi (e.g., WL4), and step 1180 includes accessing WLi−1 (e.g., WL3) coarse read data and using it to perform fine programming of WLi−1. Step 1185 includes reading WLi (e.g., WL4), and step 1190 includes accessing WLi (e.g., WL4) coarse read data and using it to perform fine programming of WLi. The programming operation ends at step 1195.

Figure 12A:
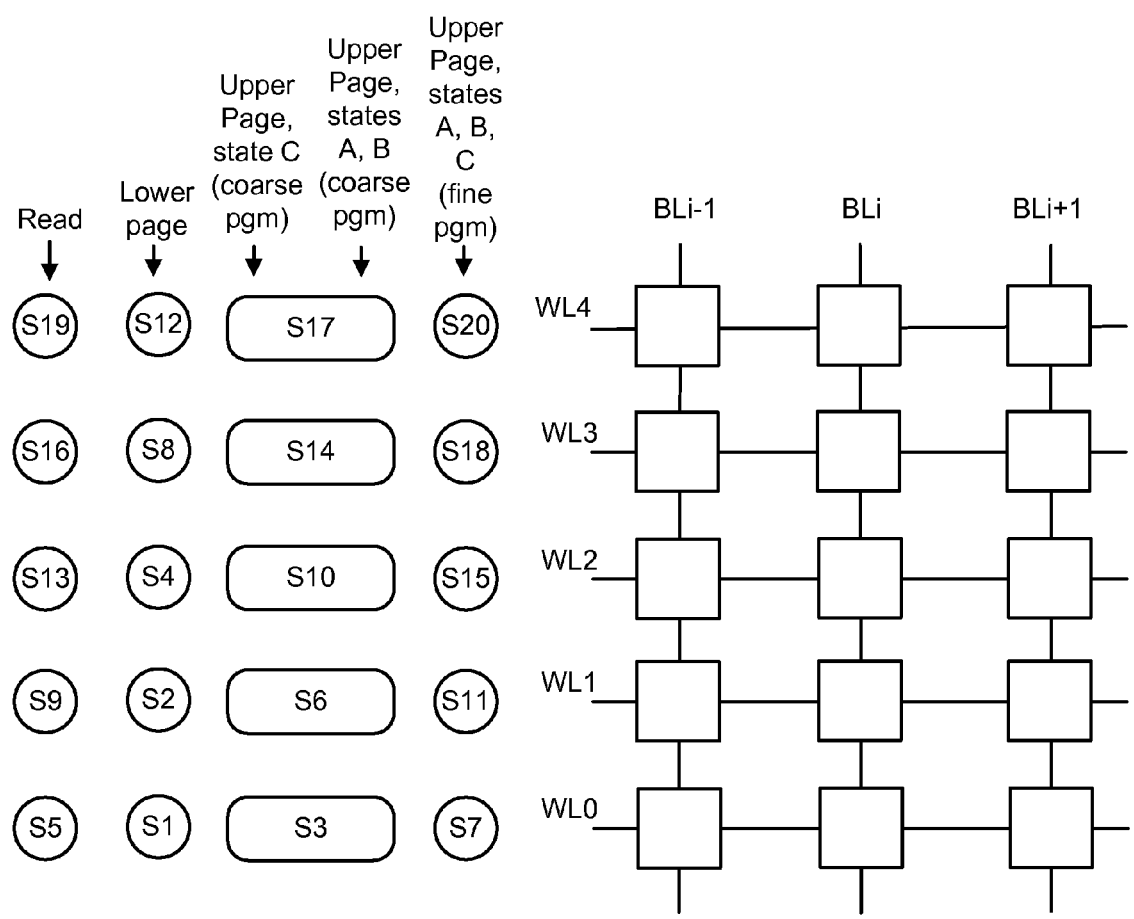
FIG. 12a depicts an additional multi-pass programming process.

A further programming option is discussed next in connection with FIGS. 12a-12e. FIG. 12a depicts an additional multi-pass programming process which is analogous to FIG. 8 except the upper page coarse programming is performed for the C state before the A and B states. Here, S3, S6, S10, S14 and S17 denote steps for performing coarse programming of the upper page for state C storage elements, followed by coarse programming of the upper page for state A and B storage elements. S7, S11, S15, S18 and S20 denote steps for fine programming of the upper page for all states, e.g., A, B and C.

FIGS. 12b-12e depict threshold voltage distributions for a programming technique associated with FIG. 12a.

Figure 12B:
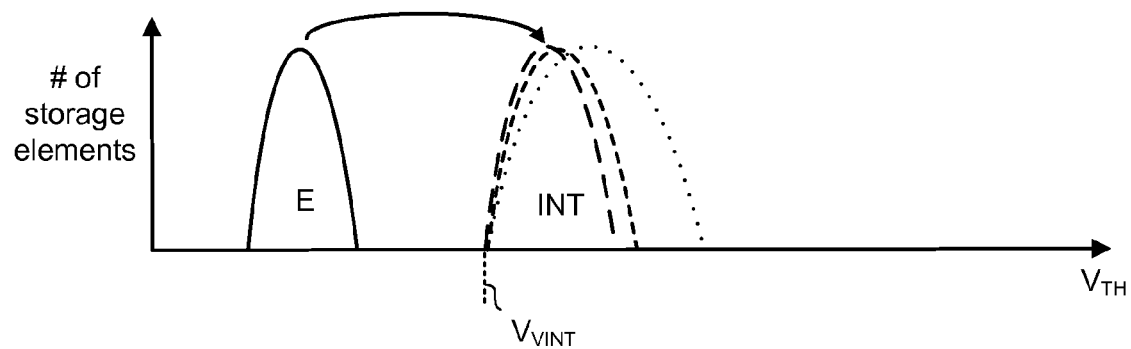

FIG. 12b depicts changes in threshold voltages after lower page programming, in which an intermediate verify voltage is used. This option can also reduce the impact of disturbs and neighbor-cell interference effects. It mainly reduces bit line-to-bit line interference and program disturb. This programming technique is referred to as "C-first" or "highest state first," where the C state represents the highest state in a four data state, multi-level implementation. The technique can be extended to eight, sixteen or other numbers of states. Such techniques involve programming all of the highest state cells to their intended state, using a coarse verify level, before coarse programming of lower state cells.

In FIG. 12b, the B and C state storage elements (that is, elements which are to be ultimately programmed to state B or C, respectively) are programmed using $V_{VINT}$ as a verify level. The long dashed line depicts the INT $V_{TH}$ distribution for WLn just after the lower page programming of WLn, the short dashed line depicts the INT $V_{TH}$ distribution for WLn after coarse upper page programming of WLn−1, and the dotted line depicts the INT $V_{TH}$ distribution for WLn after lower page programming of WLn+1.

Figure 12C:
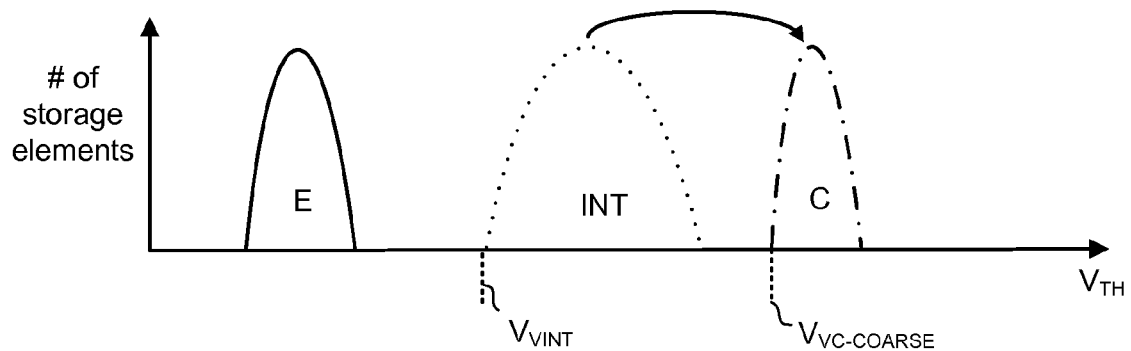

FIG. 12c depicts a $V_{TH}$ distribution just after coarse upper page programming of the C state storage elements, as represented by a dot-dash line. The dotted line of the INT state of FIG. 12b is repeated for reference. A transition in $V_{TH}$ is depicted by an arrow for the C state storage elements. The $V_{TH}$ of the B state storage elements remains at INT.

Figure 12D:
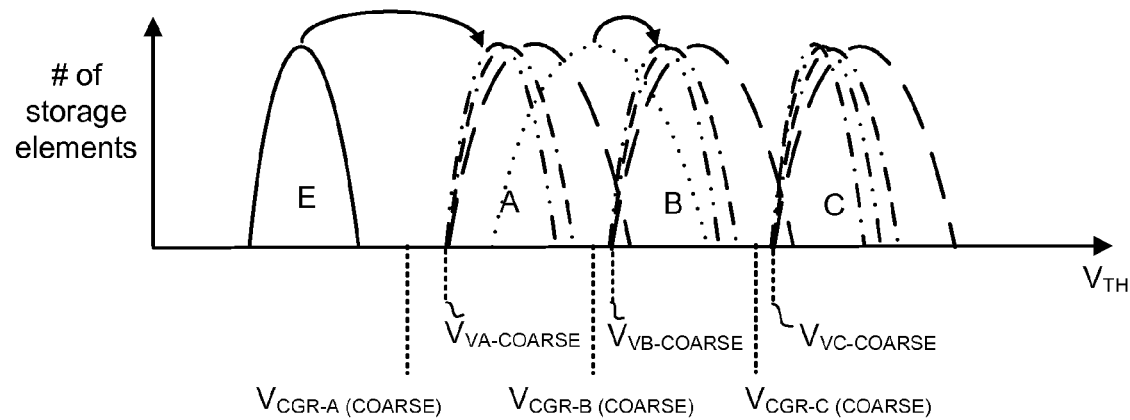

FIG. 12d depicts coarse upper page programming of A and B storage elements in which lower verify voltages for A and B states are used. The A state storage elements are programmed from state E using the lower verify level $V_{VA-COARSE}$ and the B state storage elements are programmed from the INT state using the verify level $V_{VB-COARSE}$. The dotted line of the INT state of FIG. 12c is repeated in FIG. 12d for reference. The C state storage elements are locked out from programming at this time, in one possible approach. The coarse upper page programming of A and B storage elements causes a shift in the $V_{TH}$ of the C state storage elements from the distribution represented by the dash-dot line to the distribution represented by the dash-dot-dot line. The dash-dot-dot lines depict the $V_{TH}$ distribution of WLn for states A, B and C just after the coarse upper page programming of state A and B storage elements of WLn. Further, the dash-dash-dot line depicts the $V_{TH}$ distribution of the storage elements of WLn after fine upper page programming of WLn−1, where a small coupling shift is experienced, and the dashed line depicts the $V_{TH}$ distribution of the storage elements of WLn after coarse upper page programming of WLn+1, where a larger coupling shift is experience.

Figure 12E:
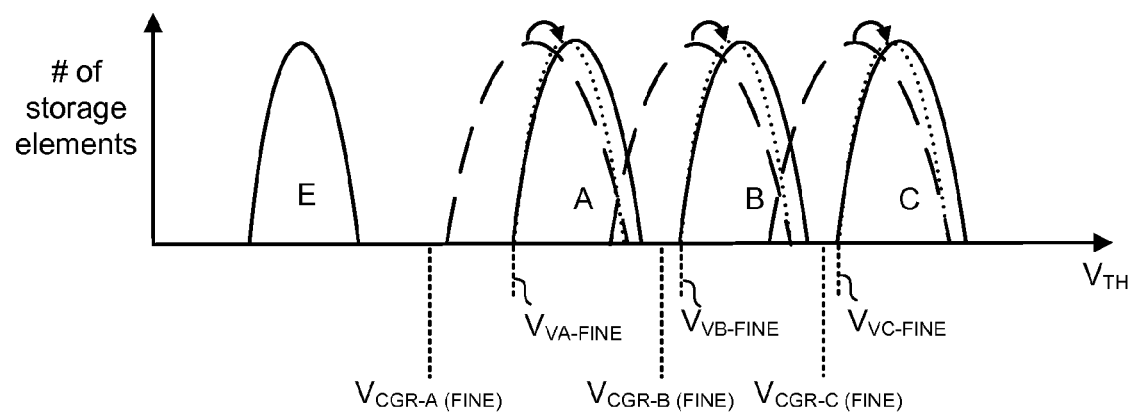

FIG. 12e depicts fine, upper page programming in which higher verify voltages for A, B and C states are used. Specifically, the A, B and C state storage elements are programmed using the higher verify levels $V_{VA-FINE}$, $V_{VB-FINE}$ and $V_{VC-FINE}$, respectively. Just after the fine upper page programming of WLn, the storage elements have $V_{TH}$ distributions which are represented by the dotted lines. The distributions of FIG. 12d which were represented by dashed lines are repeated in FIG. 12e for reference, with arrows indicating how the distributions are narrowed. After fine programming on WLn+1, the $V_{TH}$ distributions for WLn are shifted slightly higher as represented by the solid lines.

An example implementation of a non-volatile storage device which can perform the above-mentioned techniques is discussed next.

Figure 13:
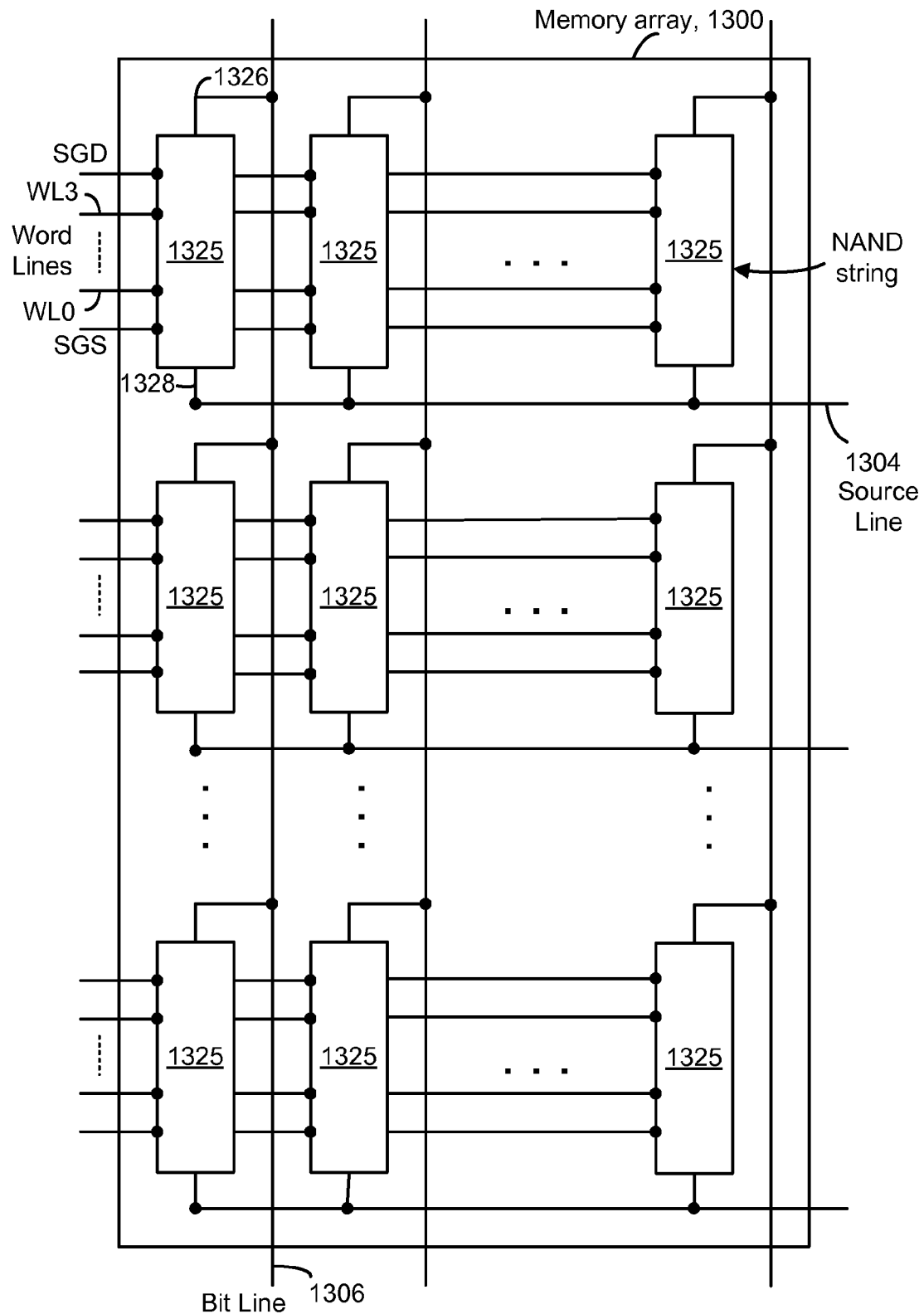
FIG. 13 is a block diagram of an array of NAND flash storage elements.

FIG. 13 illustrates an example of an array 1300 of NAND storage elements, such as those shown in FIGS. 1a and 1b. Along each column, a bit line 1306 is coupled to the drain terminal 1326 of the drain select gate for the NAND string 1325. Along each row of NAND strings, a source line 1304 may connect all the source terminals 1328 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Erasing can be performed on the entire memory array, separate blocks, or another unit of storage elements.

In addition to NAND, the techniques provided herein are applicable to other non-volatile storage technologies including NOR.

Figure 14:
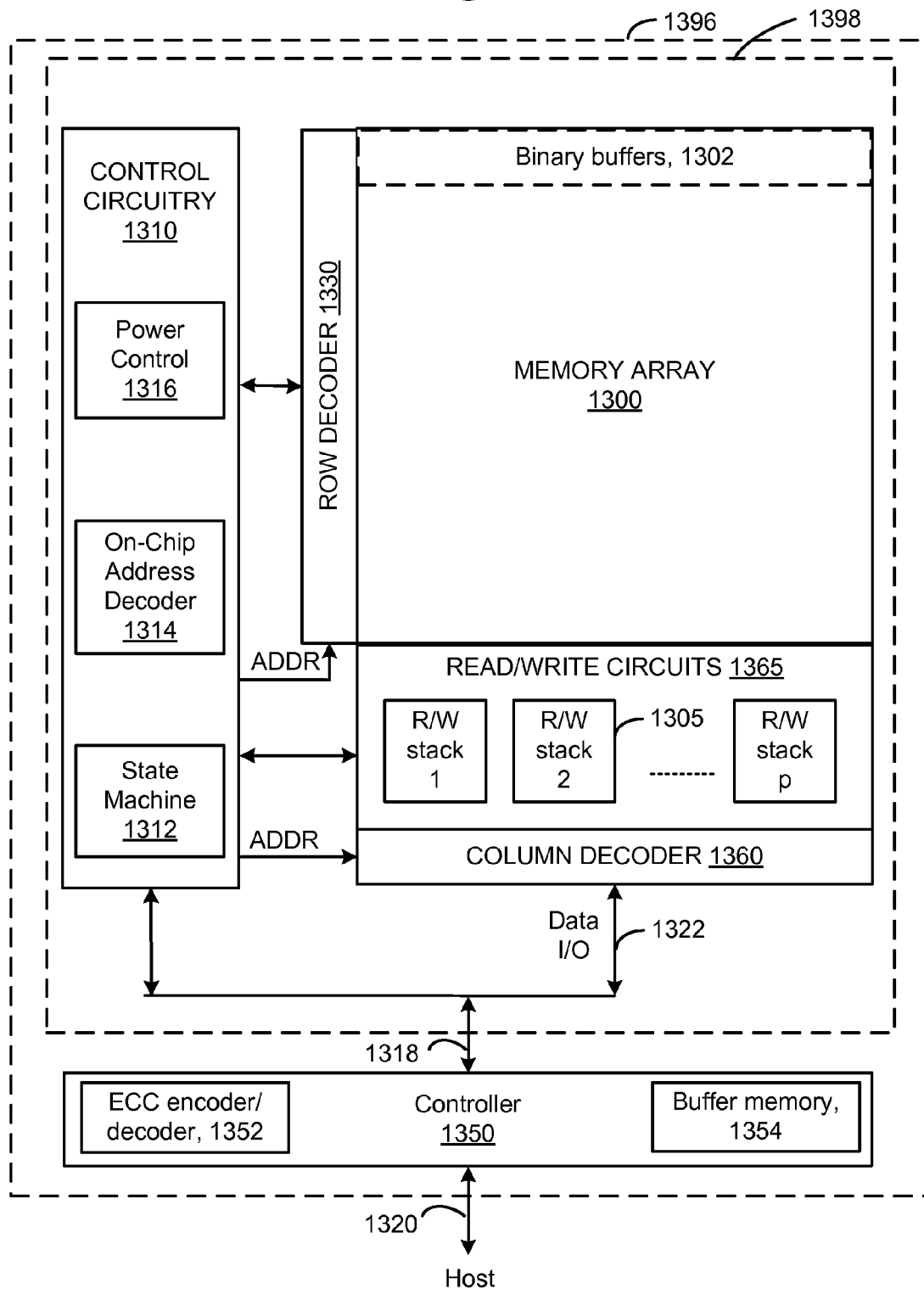
FIG. 14 is a block diagram of a non-volatile memory system using single row/column decoders and read/write circuits.

FIG. 14 is a block diagram of a non-volatile memory system using single row/column decoders and read/write circuits. The diagram illustrates a memory device 1396 having read/write circuits for reading and programming a page of storage elements in parallel, according to one embodiment of the present invention. Memory device 1396 may include one or more memory die 1398. Memory die 1398 includes a two-dimensional array of storage elements 1300, control circuitry 1310, and read/write circuits 1365. In some embodiments, the array of storage elements can be three dimensional. The memory array 1300 is addressable by word lines via a row decoder 1330 and by bit lines via a column decoder 1360. The read/write circuits 1365 include multiple read/write (R/W) stacks 1305 which allow a page of storage elements to be read or programmed in parallel. Each read/write (R/W) stack 1305 is on-chip circuitry. Binary buffers 1302 are also associated with the memory array. Typically an off-chip controller 1350 is included in the same memory device 1396 (e.g., a removable storage card) as the one or more memory die 1398. Commands and Data are transferred between the host and controller 1350 via lines 1320 and between the controller and the one or more memory die 1398 via lines 1318.

The control circuitry 1310 cooperates with the read/write circuits 1365 to perform memory operations on the memory array 1000. The control circuitry 1310 includes a state machine 1312, an on-chip address decoder 1314 and a power control module 1316. The state machine 1312 provides chip-level control of memory operations. The on-chip address decoder 1314 provides an address interface between that used by the host or a memory controller to the hardware address used by the decoders 1330 and 1360. The power control module 1316 controls the power and voltages supplied to the word lines and bit lines during memory operations.

In some implementations, some of the components can be combined. In various designs, one or more of the components (alone or in combination), other than memory array 1300, can be thought of as a managing or control circuit. For example, one or more managing or control circuits may include any one of or a combination of control circuitry 1310, state machine 1312, decoders 1314/1360, power control 1316, R/W stacks 1305, read/write circuits 1365, controller 1350, etc.

In another approach, access to the memory array 1300 by the various peripheral circuits is implemented in a symmetric fashion, on opposite sides of the array, so that the densities of access lines and circuitry on each side are reduced by half. Thus, the row decoder is split into two row decoders and the column decoder is split into two column decoders. Similarly, the read/write circuits are split into read/write circuits connecting to bit lines from the bottom of the array 1300 and read/write circuits connecting to bit lines from the top of the array 1300. In this way, the density of the read/write modules is essentially reduced by one half.

The controller 1350 can include an ECC encoder/decoder 1352 and a buffer memory 1354. The ECC encoder/decoder 1352 is used for encoding and decoding data of a word line which is programmed and read during a multi-pass programming process, as discussed previously, e.g., in connection with FIG. 7a. Encoding, including ECC coding, is done before the data is coarse programmed. The ECC encoder/decoder 1352 can similarly be used for decoding raw data which is read from a word line, performing error correction and detection, and determining whether an error threshold has been exceeded. The buffer memory 1354, binary buffers 1320 and data latches are typically temporary, volatile data storage locations.

Figure 15:
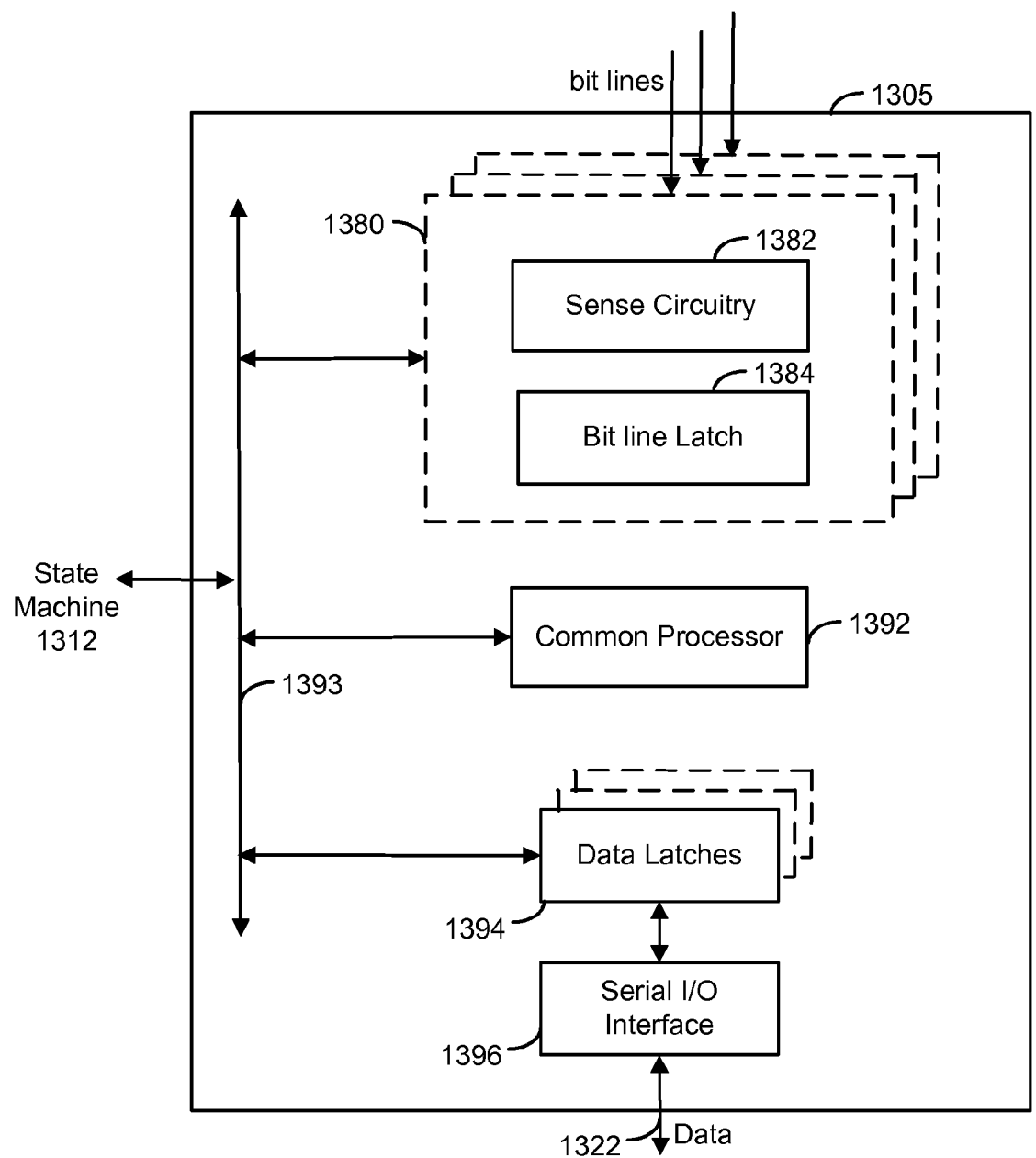
FIG. 15 is a block diagram depicting one embodiment of a read/write stack.

FIG. 15 is a block diagram depicting one embodiment of a read/write stack, also referred to as a sense block. As mentioned, a bank of partitioned R/W stacks may be provided to implement the read/write circuits 1365 of FIG. 14, in one possible approach. An example individual R/W stack 1305 includes a stack of sense modules 1380 for sensing k respective bit lines, a common processor 1392 to process data and coordinate transferring data, data latches 1394 for each respective bit line, and an I/O interface module 1396. Thus, in one possible embodiment, there will be a separate sense module 1380 for each bit line and one common processor 1392 for a set of sense modules 1380. The sense modules 1380, common processor 1392 and data latches 1394 may communicate via a data bus 1393. Further, the data latches 1394 may communicate with the I/O interface 1396 directly. A state machine 1312 (FIG. 14) may communicate with the bus 1393 optionally via a stack bus controller. For further details, refer to U.S. 2006/0140007 and U.S. 2008/0065813, both incorporated herein by reference.

Sense module 1380 comprises sense circuitry 1382, e.g., a sense amplifier, which determines whether a conduction current in a connected bit line is above or below a predetermined threshold level. Sense module 1380 also includes a bit line latch 1384 that is used to set a voltage condition on the connected bit line. For example, a predetermined state latched in bit line latch 1384 will result in the connected bit line being pulled to a state designating program inhibit (e.g., $V_{DD}$).

Common processor 1392 performs computations. For example, one of its functions is to determine the data stored in the sensed storage element and store the determined data in the set of data latches 1394. The set of data latches 1394 is used to store data bits determined by processor 1392 during a read operation. It is also used to store data bits imported from the data bus 1320 during a program operation. The imported data bits represent write data meant to be programmed into the memory. I/O interface 1396 provides an interface between data latches 1394 and the data bus 1320.

During read or sensing, the operation of the system is under the control of state machine 1312 that controls the supply of different control gate voltages to the addressed storage element. As it steps through the various predefined control gate voltages corresponding to the various memory states supported by the memory, the sense module 1380 may trip at one of these voltages and an output will be provided from sense module 1380 to processor 1392 via bus 1393. At that point, processor 1392 determines the resultant memory state by consideration of the tripping event(s) of the sense module and the information about the applied control gate voltage from the state machine via input lines 1393. It then computes a binary encoding for the memory state and stores the resultant data bits into data latches 1394. In another embodiment, bit line latch 1384 serves double duty, both as a latch for latching the output of the sense module 1380 and also as a bit line latch as described above.

Some implementations can include multiple processors 1392. In one embodiment, each processor 1392 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1392 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1394 from the data bus 1320. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1392 monitors the read back memory state relative to the desired memory state. When the two are in agreement, the processor 1392 sets the bit line latch 1384 so as to cause the bit line to be pulled to a state designating program inhibit. This inhibits the storage element coupled to the bit line from further programming even if programming pulses appear on its control gate. In other embodiments the processor initially loads the bit line latch 1384 and the sense circuitry sets it to an inhibit value during the verify process.

Data latch stack 1394 contains a stack of data latches corresponding to the sense modules. In one embodiment, there are three data latches per sense module 1380. In some implementations (but not required), the data latches are implemented as a shift register so that the parallel data stored therein is converted to serial data for data bus 1320, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in U.S. Pat. No. 7,196,931, U.S. Pat. No. 7,023,736, U.S. Pat. No. 7,046,568, U.S. 2006/0221692, and U.S. 2006/0158947. All five of the immediately above-listed patent documents are incorporated herein by reference in their entirety.

As mentioned, a number of the R/W stacks may be provided, where each is responsible for storing a respective portion of user data to respective storage elements of a selected word line. The R/W stacks may operate generally in parallel.

Figure 16:
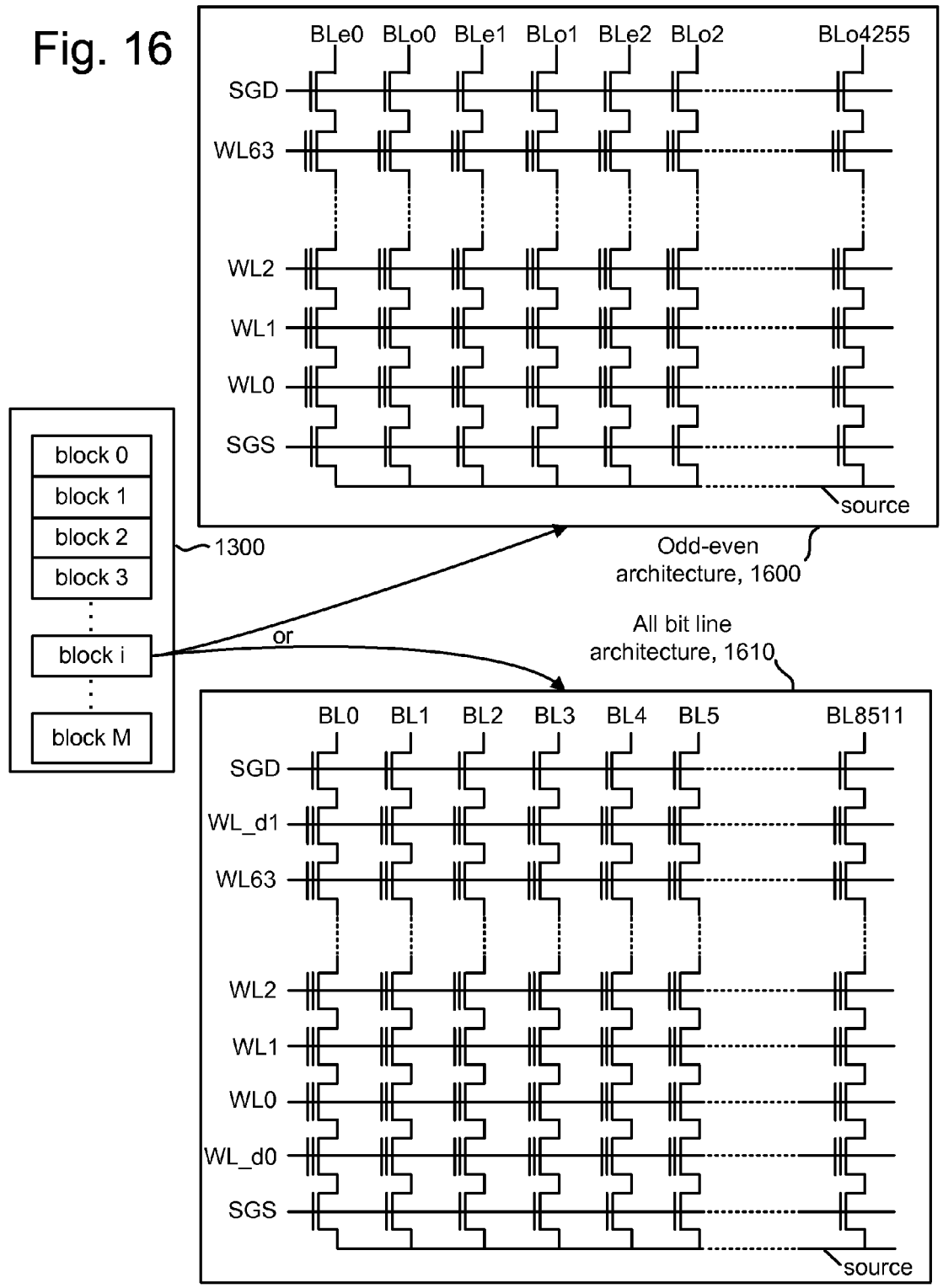
FIG. 16 illustrates an example of an organization of a memory array into blocks for an all bit line memory architecture or for an even-odd memory architecture.

FIG. 16 illustrates an example of an organization of a memory array into blocks for an all bit line memory architecture or for an odd-even memory architecture. Exemplary structures of memory array 1600 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1610), all the bit lines of a block can be simultaneously selected during read and program operations. Storage elements along a common word line and connected to any bit line can be programmed at the same time.

In the example provided, 64 storage elements are connected in series to form a NAND string. There are sixty four data word lines, where each NAND string includes sixty four data storage elements. In other embodiments, the NAND strings can have more or less than 64 data storage elements.

One terminal of the NAND string is connected to a corresponding bit line via a drain select gate (connected to select gate drain lines SGD), and another terminal is connected to c-source via a source select gate (connected to select gate source line SGS).

In one embodiment, referred to as an odd-even architecture (architecture 1600), the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating non-volatile storage, comprising:
 (a) programming a particular non-volatile storage element to raise its threshold voltage above a coarse verify level, including verifying that the threshold voltage is above the coarse verify level, the coarse verify level is associated with a target data state of the particular non-volatile storage element;
 (b) after the verifying, programming at least one other non-volatile storage element which is series-connected to the particular non-volatile storage element;

(c) reading the particular non-volatile storage element after the programming of the at least one other non-volatile storage element, to classify the particular non-volatile storage element into the target data state based on the threshold voltage; and (d) responsive to the classifying, further programming the particular non-volatile storage element to raise its threshold voltage above a fine verify level associated with the target data state.

2. The method of claim 1, wherein:
the classifying comprises determining that the threshold voltage is in a threshold voltage interval associated with the target data state.

3. The method of claim 1, wherein:
the particular non-volatile storage element and the at least one other non-volatile storage element are in a NAND string of a memory device.

4. The method of claim 3, further comprising:
storing first binary data in the memory device, the programming of step (a) is responsive to the first binary data; and
storing second binary data in the memory device in response to the reading, the further programming of step (d) is responsive to the second binary data but not the first binary data, and the second binary data is not stored in the memory device during the programming of step (a).

5. The method of claim 1, further comprising:
prior to step (a), programming the particular non-volatile storage element using a first page of data, the programming of step (a) is a first programming pass using a second page of data, and the further programming of step (d) is a second programming pass using the second page of data.

6. The method of claim 1, wherein:
the reading includes applying, in turn, a plurality of control gate read voltages which are associated with a corresponding plurality of target data states, to the particular non-volatile storage element.

7. A non-volatile storage apparatus, comprising:
a set of non-volatile storage elements on a memory chip; and
one or more control circuits in communication with the set of non-volatile storage elements, the one or more control circuits: (a) in a coarse programming pass, program a particular non-volatile storage element of the set to raise its threshold voltage to a first level which is above a first verify level, including verifying that the threshold voltage is above the first verify level, the first verify level is associated with a target data state of the particular non-volatile storage element, (b) read the particular non-volatile storage element after the verifying to obtain read data which indicates a target data state to which the particular non-volatile storage element is to be programmed to in a fine programming pass, and (c) responsive to the read data, further program the particular non-volatile storage element in the fine programming pass to raise its threshold voltage above a second verify level, the second verify level is based on the read data.

8. The non-volatile storage apparatus of claim 7, wherein;
the particular non-volatile storage element is series-connected to other non-volatile storage elements in the set of non-volatile storage elements; and
the one or more control circuits program at least one of the other non-volatile storage elements after the programming of the particular non-volatile storage element in the coarse programming pass and before the reading and the further programming of the particular non-volatile storage element in the fine programming pass.

9. The non-volatile storage apparatus of claim 7, wherein the one or more control circuits:
store first binary data in the memory chip;
perform the programming of the particular non-volatile storage element in the coarse programming pass responsive to the first binary data;
store the read data in the memory chip in response to the reading of the particular non-volatile storage element after the programming; and
perform the further programming of the particular non-volatile storage element in the fine programming pass responsive to the read data but not the first binary data.

10. The non-volatile storage apparatus of claim 7, wherein:
prior to the programming of the particular non-volatile storage element in the coarse programming pass, the one or more control circuits program the particular non-volatile storage element using a first page of data;
the one or more control circuits perform the programming of the particular non-volatile storage element in the coarse programming pass using a second page of data; and
the one or more control circuits perform the further programming of the particular non-volatile storage element in the fine programming pass using the second page of data.

11. The non-volatile storage apparatus of claim 7, wherein:
to perform the reading of the particular non-volatile storage element, the one or more control circuits apply, in turn, a plurality of control gate read voltages which are associated with a corresponding plurality of data states, to the particular non-volatile storage element.

* * * * *